(12) United States Patent
Schierl et al.

(10) Patent No.: US 10,873,766 B2
(45) Date of Patent: *Dec. 22, 2020

(54) CODING CONCEPT ALLOWING PARALLEL PROCESSING, TRANSPORT DEMULTIPLEXER AND VIDEO BITSTREAM

(71) Applicant: GE VIDEO COMPRESSION, LLC, Albany, NY (US)

(72) Inventors: Thomas Schierl, Berlin (DE); Valeri George, Berlin (DE); Karsten Grueneberg, Berlin (DE); Heiner Kirchhoffer, Berlin (DE); Anastasia Henkel, Berlin (DE); Detlev Marpe, Berlin (DE)

(73) Assignee: GE VIDEO COMPRESSION, LLC, Albany, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/222,116

(22) Filed: Dec. 17, 2018

(65) Prior Publication Data

US 2019/0124364 A1   Apr. 25, 2019

Related U.S. Application Data

(63) Continuation of application No. 15/890,820, filed on Feb. 7, 2018, which is a continuation of application
(Continued)

(51) Int. Cl.
*H04N 19/65* (2014.01)
*H04N 19/91* (2014.01)
(Continued)

(52) U.S. Cl.
CPC ........... *H04N 19/91* (2014.11); *H04N 19/107* (2014.11); *H04N 19/13* (2014.11); *H04N 19/169* (2014.11); *H04N 19/436* (2014.11); *H04N 19/65* (2014.11)

(58) Field of Classification Search
None
See application file for complete search history.

(56) References Cited

U.S. PATENT DOCUMENTS

| 5,926,205 A | 7/1999 | Krause et al. |
| 6,683,909 B1 | 1/2004 | Falco |

(Continued)

FOREIGN PATENT DOCUMENTS

| CN | 101170688 A | 4/2008 |
| CN | 101198051 B | 6/2008 |

(Continued)

OTHER PUBLICATIONS

Clare et al., Wavefront Parallel Processing for HEVC Encoding and Decoding, Joint Collaborative Team on Video Coding (JCT-VC) of ITU-T SGI 6 WP3 and ISO/I EC JTC1/SC29/WG11,6th Meeting: Torino, IT, Jul. 14-22, 2011 (Year: 2011).*

(Continued)

*Primary Examiner* — Xiaolan Xu
(74) *Attorney, Agent, or Firm* — Pillsbury Winthrop Shaw Pittman, LLP

(57) ABSTRACT

A raw byte sequence payload describing a picture in slices, WPP substreams or tiles and coded using context-adaptive binary arithmetic coding is subdivided into tranches with continuing the context-adaptive binary arithmetic coding probability adaptation across tranche boundaries. Thereby, tranche boundaries introduced within slices, WPP substreams or tiles do not lead to a reduction in the entropy coding efficiency of these entities. However, the tranches are smaller than the original slices, WPP substreams or tiles and accordingly they may be transmitted with a lower delay, than the un-chopped original entities. According to another aspect combinable with the first aspect, substream marker NAL units are used within a sequence of NAL units of a video bitstream to enable a transport demultiplexer to assign
(Continued)

data of slices within NAL units to the corresponding substreams or tiles to be able to, in parallel, serve a multi-threaded decoder with the corresponding substreams or tiles.

26 Claims, 17 Drawing Sheets

Related U.S. Application Data

No. 14/334,789, filed on Jul. 18, 2014, now Pat. No. 9,930,368, which is a continuation of application No. PCT/EP2013/051043, filed on Jul. 21, 2013.

(60) Provisional application No. 61/588,849, filed on Jan. 20, 2012.

(51) Int. Cl.
| | |
|---|---|
| H04N 19/107 | (2014.01) |
| H04N 19/169 | (2014.01) |
| H04N 19/436 | (2014.01) |
| H04N 19/13 | (2014.01) |

(56) References Cited

U.S. PATENT DOCUMENTS

| | | |
|---|---|---|
| 2005/0018774 A1 | 1/2005 | Winger |
| 2005/0097361 A1 | 5/2005 | Apostolopoulos et al. |
| 2006/0062200 A1 | 3/2006 | Wang et al. |
| 2006/0062312 A1 | 3/2006 | Lee et al. |
| 2009/0175349 A1 | 7/2009 | Ye et al. |
| 2010/0097248 A1 | 4/2010 | Sze |
| 2010/0135416 A1 | 6/2010 | Huang |
| 2010/0166388 A1* | 7/2010 | Ushiki .............. H04N 17/00 388/241 |
| 2011/0026604 A1 | 2/2011 | Zhao |
| 2011/0194613 A1 | 8/2011 | Chen |
| 2011/0285560 A1 | 11/2011 | Chang |
| 2012/0081241 A1 | 4/2012 | Misra |
| 2012/0163457 A1 | 6/2012 | Wahadaniah |
| 2013/0018406 A1 | 1/2013 | Campbell et al. |
| 2014/0105293 A1* | 4/2014 | George ............. H04N 19/503 375/240.12 |

FOREIGN PATENT DOCUMENTS

| | | |
|---|---|---|
| CN | 101902639 A | 12/2010 |
| JP | 2001-512648 | 8/2001 |
| JP | 2007-516660 | 6/2007 |
| JP | 2007-525038 | 8/2007 |
| JP | 2007214998 A | 8/2007 |
| JP | 2008-141483 | 6/2008 |
| JP | 2011-061363 | 3/2011 |
| JP | 2011-097651 | 5/2011 |
| JP | 2011515880 A | 5/2011 |
| JP | 2014-520632 A | 8/2014 |
| KR | 1020070064642 A | 6/2007 |
| KR | 1020100072347 A | 6/2010 |
| RU | 2335857 C2 | 10/2008 |
| RU | 2374786 C1 | 11/2009 |
| TW | 201143440 A | 12/2011 |
| TW | 201349878 A | 12/2013 |
| TW | 201408074 A | 2/2014 |
| WO | 2013010997 A1 | 1/2013 |

OTHER PUBLICATIONS

Clare et al., "Wavefront Parallel Processing for HVEC Encoding and Decoding", Joint Collaborative Team on Video Coding (JCT-VC) of ITU-T SG16 WP3 and ISO/IEC JTC1/SC29/WG11 6th Meeting: Torino, IT, Jul. 14-22, 2011 (Year: 2011)*

Office Action dated Mar. 14, 2017 in Japanese Application 2016-074310.

Clare et al., Wavefront Parallel Processing for Hevc Encoding and Decoding, Joint Collaborative Team on Video Coding (JCT-VC) of ITU-T SG16 WP3 and ISO/IEC JTC1/SC29/WG11, 6th Meeting: Torino, IT, Jul. 14-22, 2011.

Decision on Grant dated Oct. 3, 2016 in Russian Application 2014134041.

Office Action dated Oct. 9, 2016 in Chinese Application 2013800061051.

Office Action dated Nov. 10, 2015 in parallel Japanese Patent Application No. 2014-552650, 19 pages.

Ono, Sadayasu, et al., Ubiquitous Technique High Efficiency encoding of images—MPEG-4 and H.264-, 1st Ed., Apr. 20, 2005, Ohm Co., Ltd., p. 124-136, ISBN: 4-274-20060-4, 19 pages.

Hsu, Chih-Wei, et al., "AHG4: Wavefront tile parallel processing", [online], Nov. 27, 2011, Joint Collaborative Team on Video Coding (JCT-VC) of ITU-T SG16 WP3 and ISO/IEC JTC1/SC29/WG11, Document: JCTVC-G199 (version 6), [Searched on Nov. 10, 2015], Internet <URL: http://phenix.it-sudparis.eu/jct/doc_end_user/documents/7_Geneva/wg11/JCTVC-G199-v6, zip> (The date of the document was publicly known is the date of the time stamp of the file.); 13 pages.

Fogg, Chad, et al., "HEVC Profile & Level limits, for parallel partitions in particular", [online], Nov. 9, 2011, Joint Collaborative Team on Video Coding (JCT-VC) of ITU-T SG16 WP3 and ISO/IEC JTC1/SC29/WG11, Document: JCTVC-G661 (verion 1), [Searched on Nov. 10, 2015], Internet <URL: http://phenix.it-sudparis.eu/jct/doc_end_user/documents/7_Geneva/wg11/JCTVC-G661-v1.zip> (The date of the document was publicly known is the date of the time stamp of the file.); 9 pages.

Feature 2 All about MPEG and Internet communication <<core>> of streaming technique Chapter 3, Underlying technology Sec. 1 Video compression, Embedded Software Press, vol. 12, Sep. 1, 2008, Gijutsu-Hyohron Co., Ltd., p. 65-87, ISBN: 978-4-7741-3571-7; 29 pages.

Office Action, dated Dec. 17, 2015, in parallel Taiwanese Patent Application No. 102102205, 19 pages.

C. C. Chi et al., "Parallel scalability and efficiency of HEVC parallelization approaches," IEEE Trans. Circuits Syst., Video Technol., vol. 22, No. 12, pp. 1827-1838, Dec. 2012, 7 pages.

Official Communication issued in corresponding International Application PCT/EP2013/051043, dated Feb. 8, 2013.

Wiegand, T. et al., "Overview of the H.264/AVC Video Coding Standard", IEEE Transactions on Circuits and Systems for Video Technology, vol. 13, No. 7, Jul. 7, 2003, pp. 560-576.

Henry, F. et al., "Wavefront Parallel Processing", 5th JCT-VC Meeting, ITU-T SG16 WP3 and ISO/IEC JTC1/SC29/ WG11, Document: JCTVC-E196, Mar. 16-23, 2011, pp. 1-9.

Misra, K. et al., "Lightweight Slicing for Entropy Coding", 4th JCT-VC Meeting, ITU-T SG16 WP3 and ISO/IEC JTC1/ SC29/ WG11, Document: JCTVC-D070, Jan. 20-28, 2011, pp. 1-7.

Misra, K. et al., "Periodic Initialization for Wavefront Coding Functionality", 4th JCT-VC Meeting, ITU-T SG16 WP3 and ISO/IEC JTC1/SC29/WG11, Document: JCTVC-D073, Jan. 20-28, 2011, pp. 1-7.

Bross, B. et al., "WD5: Working Draft5 of High Efficiency Video Coding", 7th JCT-VC Meeting, ITU-T SG16 WP3 and ISO/IEC JTC1/SC29/WG11, Document: JCTVC-G1103_d9, Nov. 21-30, 2011, 237 pages.

Sze, V. et al., "Analysis of Entropy Slices Approaches", 4th JCT-VC Meeting, ITU-T SG16 WP3 and ISO/IEC JTC1/ SC29/WG11, Document: JCTVC-D243, Jan. 20-28, 2011, pp. 1-6.

Series H: Audiovisual and Multimedia Systems, Infrastructure of Audiovisual Services—Transmission Multiplexing and Synchronization, "Information Technology—Generic Coding of Moving Pictures and Associated Audio Information: Systems", International Standard ISO/IEC 13818-1, ITU-T Recommendation H.222.0, 2012, 234 pages.

Schulzrinne, H. et al., "RTP: A Transport Protocol for Real-Time Applications", Network Working Group, Request for Comments: 3550, Obsoletes: 1889, Category: Standards Track, Jul. 2003, pp. 1-89.

(56) References Cited

OTHER PUBLICATIONS

Wang, Y. et al., "RTP Payload Format for H.264 Video", Internet Engineering Task Force, Request for Comments: 6184, Obsoletes: 3984, Category: Standards Track, ISSN: 2070-1721, May 2011, pp. 1-101.
Clare, G. et al., "Wavefront and Cabac Flush: Different Degrees of Parallelism Without Transcoding", 6th JCT-VC Meeting, ITU-T SG16 WP3 and ISO/IEC JTC1/SC29/WG11, Document: JCTVC-F275, Jul. 14-22, 2011, pp. 1-11.
Yang, M. et al., "Cross-Check for F500", 6th JTC-VC Meeting, ITU-T SG16 WP3 and ISO/IEC JTC1/SC29/WG11, Document: JCTVC-F724, Jul. 14-22, 2011, pp. 1-2.
Handley, M. et al., "SOP: Session Description Protocol", Network Working Group, Request for Comments: 4566, Obsoletes: 2327, 3266, Category: Standards Track, Jul. 2006, pp. 1-49.
Schierl, T. et al., "RTP Payload Format for High Efficiency Video Coding Draft-Schieri-Payload-rtp-h265-01.txt", Audio/ Video Payload WG, Internet Draft, Intended Status: Standards Track, Oct. 22, 2012, pp. 1-45.
Clare, G. et al., "Wavefront Parallel Processing for HEVC Encoding and Decoding", 6th JCT-VC Meeting, ITU-T SG16 WP3 and ISO/IEC JTC1/SC29/WG11, Document: JCTVC-F274, Jul. 14-22, 2011, pp. 1-16.
Fuldseth, A. et al., "Tiles", 5th JCT-VC Meeting, ITU-T SG16 WP3 and ISO/IEC JTC1/SC29/WG11, Document: JCTVC-E408, Mar. 16-23, 2011, pp. 1-14.
Kirchhoffer, H. et al., "CE1: Report of Test Results Related to PIPE-based Unified Entropy Coding", 7th JCT-VC Meeting, ITU-T SG16 WP3 and ISO/IEC JTC1/SC29/WG11, Document: JCTVC-G633, Nov. 21-30, 2011, pp. 1-11.
Office Action dated Aug. 3, 2017 in Taiwanese Application 105131325.
Office Action dated Oct. 17, 2017 in Singapore Application 10201606621X.
Office Action U.S. Appl. No. 15/890,864 dated Apr. 11, 2018.
Office Action U.S. Appl. No. 15/890,820 dated May 3, 2018.
Notice of Allowance U.S. Appl. No. 15/890,864 dated Sep. 18, 2018.
Notice of Allowance U.S. Appl. No. 15/890,820 dated Sep. 17, 2018.
Notice of Acceptance of Application Australian Patent Application No. 2017210565 dated Jun. 7, 2019.
Notice of Allowance Philippines Application No. 1/2018/500347 dated Jun. 10, 2019.
Notice of Allowance Philippines Application No. 1/2018/50346 dated Jun. 10, 2019.
Notice of Allowance Philippines Application No. 1/2018/500344 dated Jun. 10, 2019.
Notice of Allowance Philippines Application No. 1/2018/500345 dated Jun. 10, 2019.
Notice of Allowance Vietnam Application No. 1-2014-02778 dated Jul. 22, 2019 with English translation.
Office Action dated Aug. 8, 2019 in Philippine Application 1-2019-500080.
Office Action dated Aug. 28, 2019 in European Application 13700753.0.
Office Action dated Sep. 3, 2019 in Japanese Application 2018-146900.
Office Action dated Oct. 8, 2019 in Taiwanese Applicaiton 107138649.
Decision to Grant dated Oct. 22, 2019 in Korean Patent Application 10-2018-7014596.
Rade Kutil, "Optimization of Bitstream Assembly in Parallel Multimedia Compression", Scalable Computing: Practice and Experience, 2001.
Office Action dated Dec. 22, 2019 in Israeli Application 267776.
Office Action dated Jan. 31, 2020 in Canadian Application 2861951.
Office Action dated Nov. 21, 2019 in U.S. Appl. No. 15/890,864.
Office Action dated Nov. 21, 2019 in U.S. Appl. No. 15/890,820.
Office Action dated Jan. 29, 2020 in U.S. Appl. No. 16/223,275.
Office Action dated Feb. 7, 2020 in U.S. Appl. No. 16/415,020.
Office Action issued Office Action dated Mar. 20, 2020 in European Application 13700753.0.
Office Action dated Mar. 11, 2020 in Korean Application 10-2020-7002056.
Office Action dated Mar. 17, 2020 in Japanese Application 2016-074310.
Office Action dated Apr. 17, 2020 in Taiwanese Application 107138649.
Office Action dated May 19, 2020 in Japanese Application 2018-146900.
Notice of Allowance dated Aug. 7, 2020 in U.S. Appl. No. 15/890,820.
Notice of Allowance dated Aug. 11, 2020 in U.S. Appl. No. 15/890,864.
Notice of Allowance dated Aug. 12, 2020 in U.S. Appl. No. 16/415,020.
Notice of Acceptance of Application dated Jun. 22, 2020 in Australian Patent Application No. 2019226180.
Office Action dated Aug. 20, 2020 in Brazilian Application 1220200075295.
Muhammed Coban, "Cross-check of JCTVC-F274 Wavefront Parallel Processing", 6. JCT-VC meeting; 97. MPEG meeting; Jul. 14, 2011-Jul. 22, 2011; Torino; (Joint Collaborative Team on Video Coding of ISO-IEC JTC1/SC29/WG11 and ITU-T SG.16); URL: http://wftp3.itu.int/av-arch/jctvc-site/.
Virginie Drugeon, "Cross-check of JCTVC-F274 from Orange Labs", 6. JCT-VC meeting;97. MPEG meeting; Jul. 14, 2011-Jul. 22, 2011; Torino; (Joint Collaborative Team on Video Coding of ISO/IEC JCT1/SC29/WG11 and ITU-T SG.16); URL: http://wftp3.itu.int/av-arch/jctvc-site/.
Notice of Allowance dated Aug. 11, 2020 in Mexican Application MX/a/2017/011482.
Notice of Allowance dated Aug. 11, 2020 in Mexivan Application MX/a/2017/011484.
Notice of Allowance dated Aug. 11, 2020 in Mexican Application MX/a/2017/011483.
Notice of Allowance dated Aug. 11, 2020 in Mexican Application MX/a/2017/011496.

* cited by examiner

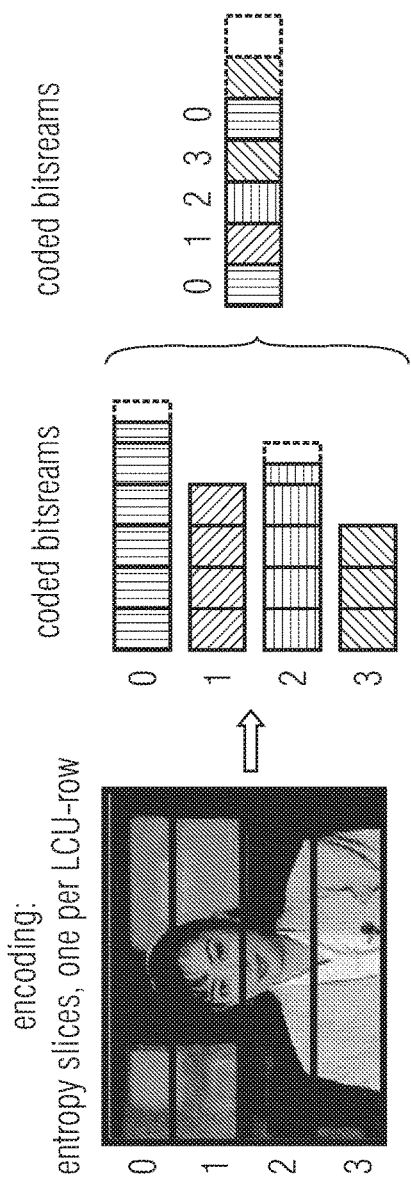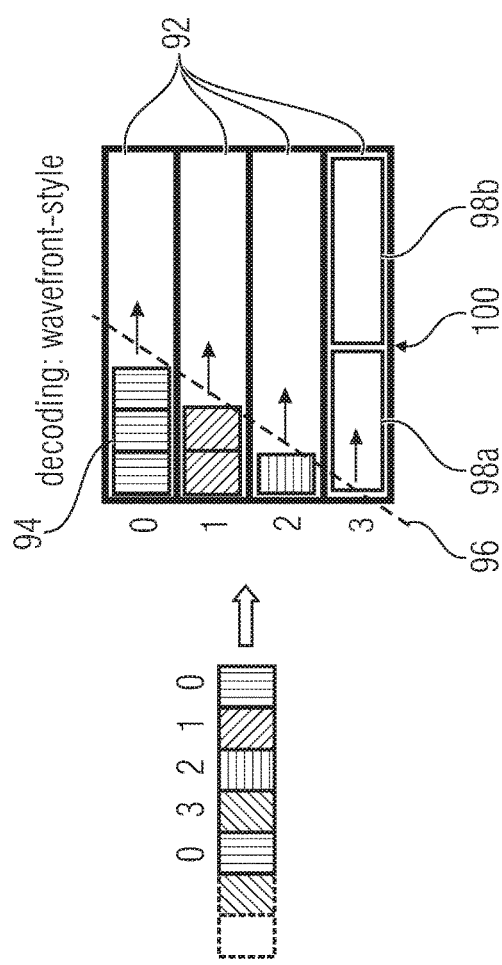
FIG 4

```
nal unit( NumBytesInNALunit, num low delay tranches ) {                    Descriptor
  forbidden_zero_bit                                                          f(1)
  nal_ref_flag                                                                u(1)
  fnal_unit_type                                                              u(6)
  NumBytesInRBSP=0
  nalUnitHeaderBytes=1
  if( nal_unit_type==1|| nal_unit_type== 4|| nal_unit_type== 5 ) {
    temporal_id                                                               u(3)
    output_flag                                                               u(1)
    low_delay_encapsulation_flag                                              u(1)
    low_delay_cyclic_flag                                                     u(1)
    reserved_one_2bits                                                        u(2)
    nalUnitHeaderBytes+=1
  }
  if( low_delay_encapsulation_flag !=1)
  {
    for( i=nalUnitHeaderBytes;i<NumBytesInNALunit; i++ ) {
      if( i+2<NumBytesInNALunit && next_bits( 24 ) == 0x000003 ) {
        rbsp_byte[ NumBytesInRBSP++ ]                                         b(8)
        rbsp_byte[ NumBytesInRBSP++ ]                                         b(8)
        i+=2
        emulation_prevention_three_byte /* equal to 0x03 */                   f(8)
      } else
        rbsp_byte[ NumBytesInRBSP++ ]                                         b(8)
    }
  }
  else{
    for ( i=0, i++, i<num_low_delay_tranches){
      NumLDBytesInRBSP[i]=0
    }
```

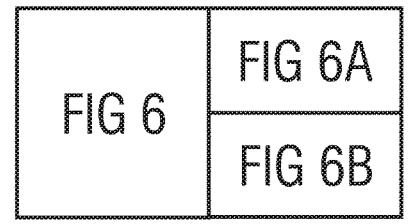

FIG 6A

```
tranch_id=-1
for ( i=0, i++, i<num_low_delay_tranches){
   NumBytesInRBSP[i]=0
}
for( i=nalUnitHeaderBytes;i<NumBytesInNALunit;i++ ) {
   if( i+2<NumBytesInNALunit && next_bits( 24 ) == 0x000002 ) {
      if( low_delay_cyclic_flag) {
         tranche_id=(tranche_id++) % num_low_delay_tranches
         i+=2
      }
      else{
         tranche_id                                                                u(8)
         i+=3
      }
   }
   else
   if( i+2<NumBytesInNALunit && next_bits( 24 ) == 0x000003 ) {
      LD_rbsp_byte[ NumLDBytesInRBSP[tranche_id]++ ] [tranche_id]                  b(8)
      LD_rbsp_byte[ NumLDBytesInRBSP[tranche_id]++ ] [tranche_id]                  b(8)
      i+=2
      emultation_prevention_three_byte /* equal to 0x03 */                         f(8)
   } else
      LD_rbsp_byte[ NumLDBytesInRBSP[tranche_id]++ ] [tranche_id]                  b(8)
}
for ( i=0, i++, i<num_low_delay_tranches){
   for ( i=0, i++, i< NumLDBytesInRBSP[i] ){
      rbsp_byte[ NumBytesInRBSP++]=LD_rbsp_byte[i][i]
   }
  }
 }
}
```

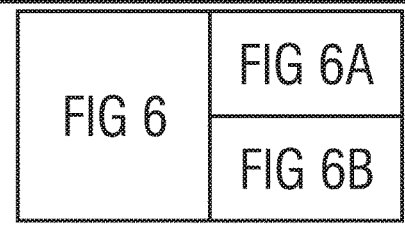

FIG 6B

```
...
  low_delay_encapsulaiton_present_flag                          u(1)
  if( low_delay_encapsulaiton_present_flag ==1){
    low_delay_cyclic_flag                                       u(1)
    num_low_delay_tranches_flag                                 u(1)
    if (num_low_delay_tranches_flag==1){
      num_low_delay_tranches                                    ue(v)
        for ( i=0; i <num_low_delay_tranches; i++){
          low_delay_tranche_lenght_minus1 [i]                   ue(v)
        }
    }
  }
...
```

FIG 7

```
low_delay_slice_layer_rbsp() {                                  Descriptor
slice_header()
tranche_id=0
for ( i=0, i++, i<num_low_delay_tranches){
  tranche_slice_data()
}
rbsp_slice_trailing_bits()
```

FIG 8

| | Descriptor |
|---|---|
| slice_header( ){<br>  entropy_slice_flag<br>  low_delay_slice_flag<br>  ....<br>  first_slice_in_pic_flag<br>  if( first_slice_in_pic_flag==0 ){<br>    slice_adress<br>    if( low_delay_slice_flag==1 )<br>      no_cabac_reset_flag<br>  }<br>  ....<br>  if( slice_type==P \|\| slice_type==B )<br>    5_minus_max_num_merge_cand<br>  for( i=0; i<num_substreams_minus1+1; i++ ){<br>    substream_length_mode<br>    substream_length[i]<br>  }<br>} | <br>u(1)<br>u(1)<br><br>u(1)<br><br>u(v)<br><br>u(1)<br><br><br><br><br>ue(v)<br><br>u(2)<br>u(v) |

FIG 9

| | Descriptor |
|---|---|
| substream_marker( gradual_decoder_refresh_steps ){<br>  forbidden_zero_bit<br>  nal_ref_flag<br>  nal_unit_type<br>  substream_ID<br>  if( gradual_decoder_refresh_steps< 1 )<br>  is_intra<br>  reserved_one_7bits<br>  }<br>} | <br>f(1)<br>u(1)<br>u(6)<br>u(8)<br><br>u(1)<br>u(7) |

FIG 10

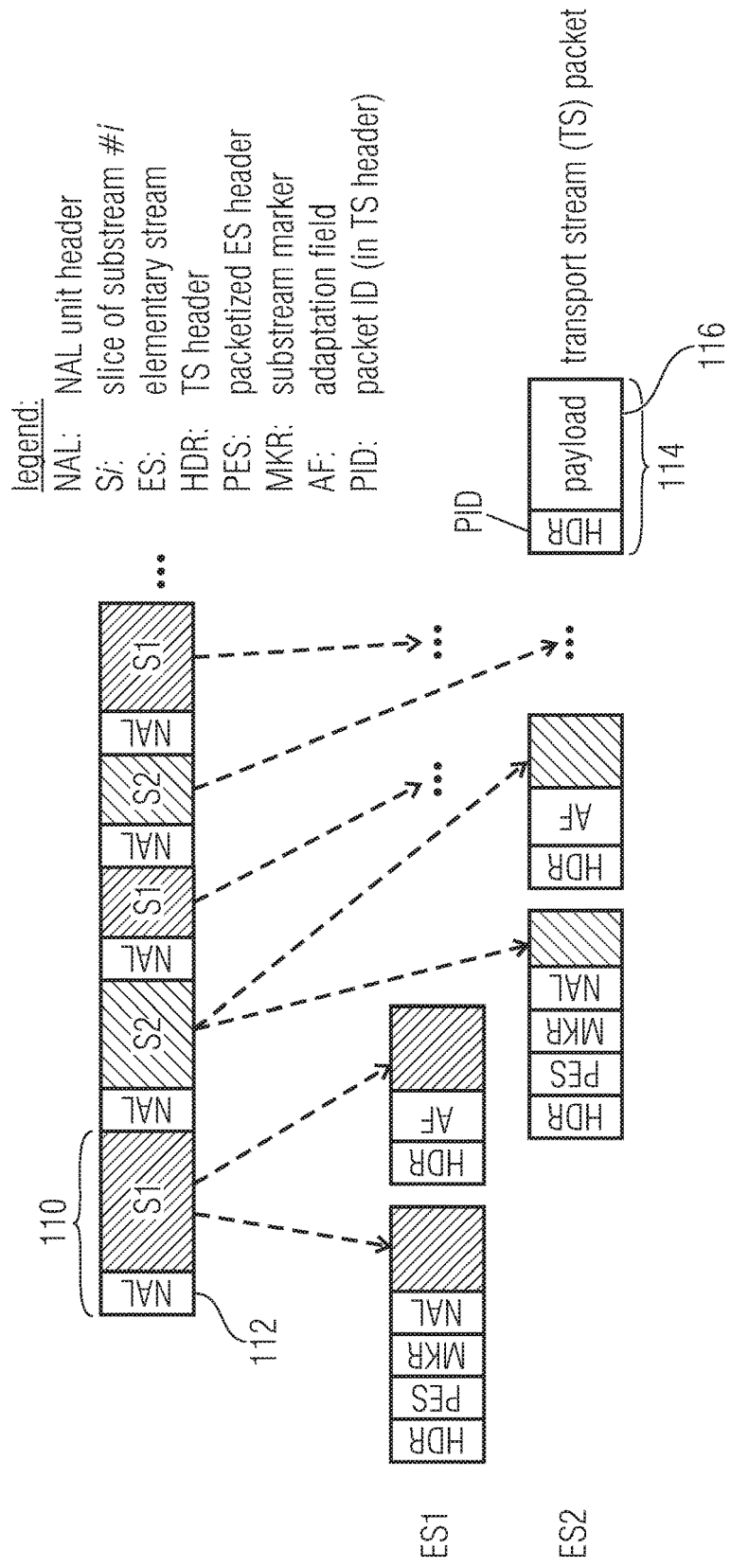

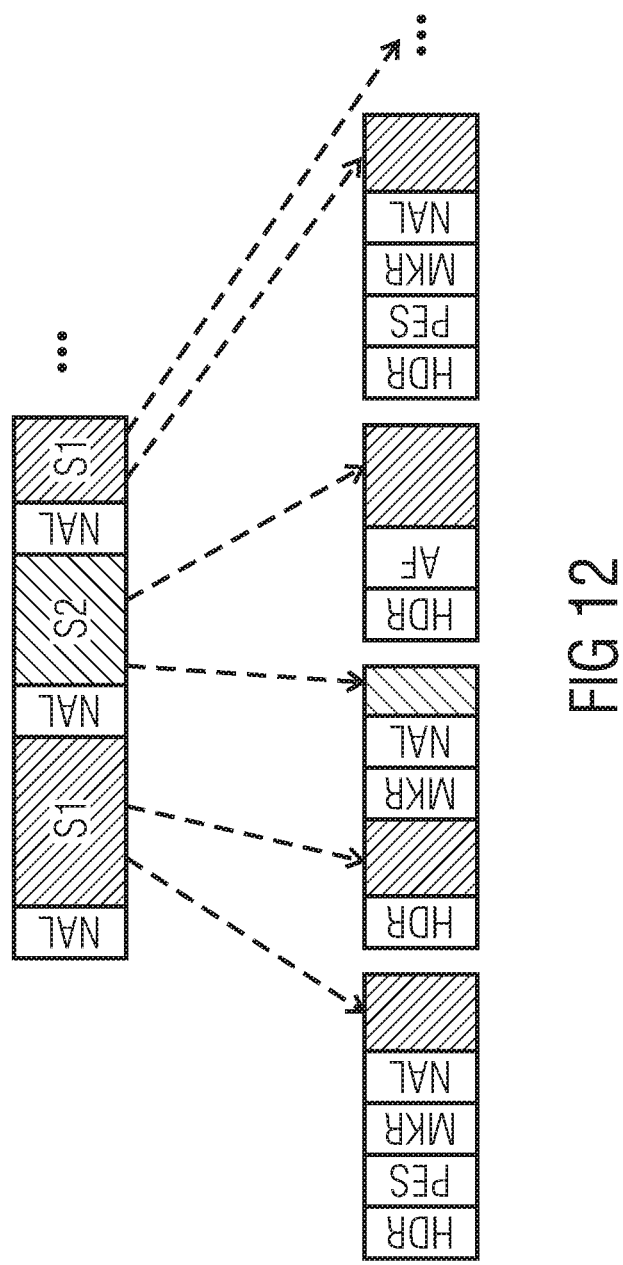

CODING CONCEPT ALLOWING PARALLEL PROCESSING, TRANSPORT DEMULTIPLEXER AND VIDEO BITSTREAM

CROSS-REFERENCE TO RELATED APPLICATIONS

This application is a Continuation of U.S. Ser. No. 15/890,820, filed Feb. 7, 2018, which is a Continuation of U.S. Ser. No. 14/334,789, filed Jul. 18, 2014, now U.S. Pat. No. 9,930,368, which is a Continuation of International Application No. PCT/EP2013/051043, filed Jan. 21, 2013, which claims priority from U.S. Patent Application 61/588,849, filed Jan. 20, 2012. Each of the foregoing patents and patent applications is incorporated herein by reference in its entirety.

BACKGROUND OF THE INVENTION

The present invention is concerned with coding concepts allowing parallel processing such as in the evolving HEVC, a transport demultiplexer and a video bitstream.

Parallelization of encoder and decoder is very important due to the increased processing requirements by the HEVC standard as well as by the expected increase of video resolution. Multi-core architectures are becoming available in a wide range of modern electronic devices. Consequently, efficient methods to enable the use of multiple-core architectures are necessitated.

Encoding or decoding of LCUs occurs in raster scan, by which the CABAC probabilities are adapted to the specificities of each image. Spatial dependencies exist between adjacent LCUs. Each LCU depends on its left, above, above-left and above-right neighbor LCUs, because of different components, for instance, motion-vector, prediction, intra-prediction and others. In order to enable parallelization in decoding, these dependencies typically need to be interrupted or are interrupted in state-of-the-art applications.

Some concepts of parallelization, namely wavefront processing using entropy slices [3], wavefront parallel processing (WPP) operations using substreams [2] [4], [11], or tiles [5] have been proposed. The latter one does not necessarily need to be combined with wavefront processing for allowing parallelization at decoder or encoder. From this point of view, tiles are similar to WPP substreams. Our initial motivator for the further study of the entropy slice concept is to perform techniques, which lower the coding efficiency loss and thus reduce the burden on the bitstream for parallelization approaches in encoder and decoder.

In order to provide a better understanding, in particular of the use of LCUs, one may first have a look at the structure of H.264/AVC [1].

A coded video sequence in H.264/AVC consists of series of access units that are collected in the NAL unit stream and they use only one sequence parameter set. Each video sequence can be decoded independently. A coded sequence consists of a sequence of coded pictures. A coded frame can be an entire frame or a single field. Each picture is partitioned into fixed-size macroblocks (in HEVC [5]: LCUs). Several macroblocks or LCUs can be merged together into one slice. A picture is therefore a collection of one or more slices. The goal of this data separation is to allow independent decoding of the samples in the area of the picture, which is represented by the slice, without the use of data from other slices.

A technique that is often referred to as "entropy slices" [3] is a splitting of the traditional slice into additional sub-slices. Specifically, it means slicing of entropy coded data of a single slice. The arrangement of entropy slices in a slice may have different varieties. The simplest one is to use each row of LCUs/macroblocks in a frame as one entropy slice. Alternative, columns or separate regions can be utilized as entropy slices, which even can be interrupted and toggled with each other, e.g. slice 1 in FIG. 1.

An obvious aim of the entropy slice concept is to enable the use of parallel CPU/GPU and multi-core architectures in order to improve the time of the decoding process, i.e. to speed-up the process. The current slice can be divided into partitions that can be parsed and reconstructed without reference to other slice data. Although a couple of advantages can be achieved with the entropy slice approach, thereby emerging some penalties.

The entropy slice concept has been further extended to the substream wavefront processing (WPP) as proposed in [2], [10], [11] and partially integrated into [5]. Here a repetition scheme of substreams is defined. Which do have an improved entropy state initialization per line compared to entropy slices.

The tile concept allows for separation of the picture information to be coded, while each title having its own raster scan order. A tile is defined by a common structure, which is repeated in the frame. A tile may also have a certain column width and line height in terms of LCUs or CUs. Titles can be also independently encoded and may also encoded in a way that they do not necessitate joint processing with other tiles, such that decoder threads can process tiles of an Access Unit fully or at least for some coding operation steps in an independent way, i.e. entropy coding and transform coding.

Therefore a tile greatly allows to run tile encoders as well as decoders fully or partially independent in a parallel way up, in the latter case, e.g. u to the filtering stage of the HEVC codec.

In order to make full usage of the parallelization techniques in the capturing, encoding, transmission, decoding and presentation chain of a video communication system, or similar systems, the transport and access of the data between the communication participants is an important and time consuming step for the whole end-to-end delay injection. This is especially a problem, if using parallelization techniques, such as tiles, substreams or entropy slices.

The data approaches of WPP substreams imply that the coded data of the partitions, if processed, do not have data locality, i.e. a single thread decoding the Access Unit, needs to jump over potentially big memory portions in order to access data of the next WPP substream line. A multi-threaded decoding system need to wait for transmission on certain data, i.e. WPP substreams, in order to work in a fully parallelized way, so that exploiting the wavefront processing.

In video-streaming, enabling of higher resolutions (Full-HD, QUAD-HD etc.) leads to higher amount of data that has to be transmitted. For time-sensitive scenarios, so called Low-Delay use-case, such as video conferencing (<145 ms), or gaming applications, (<40 ms) very low end-to-end delays are necessitated. Therefore, the transmission time becomes a critical factor. Consider the up-load link of ADSL for a video conferencing application. Here, so called random access points of stream, usually these refer to I-frames, will be the candidates to cause a bottleneck during transmission.

HEVC allows for so called Wavefront-processing as well as tile processing at the encoder as well as decoder side. This is enabled by use of entropy slices, WPP substreams, or even combination of those. Parallel processing is also allowed by parallel tile encoding and decoding.

In the "non-parallelization targeting" case, the data of a whole slice would be delivered at once, thus the last CU of the slices is accessible by the decoder if it has been transmitted. This is not a problem, if there is a single threaded decoder.

In the multi-threaded case, if multiple CPUs or cores can be used, the decoding process would like, however, to start as soon as encoded data has arrived at Wavefront-decoder or Tile-decoder threads.

Thus, it would be favorable to have concepts at hand which enable reducing the coding delay in parallel processing environments with less severe reductions in coding efficiency.

SUMMARY

An embodiment may have a decoder configured to receive raw byte sequence payload describing a picture in WPP substreams with one WPP substream per LCU row of the picture and coded using CABAC from an encoder in tranches into which the WPP substreams are segmented thereby having tranche boundaries introduced therein; entropy decoding the tranches with continuing CABAC probability adaptation across the tranche boundaries introduced within the WPP substreams; and decode the raw byte sequence payload to obtain the picture.

Another embodiment may have a decoder configured to receive raw byte sequence payload describing a picture in WPP substreams and coded using CABAC from an encoder in tranches into which the WPP substreams are segmented thereby having tranche boundaries introduced therein; entropy decoding the tranches with continuing CABAC probability adaptation across the tranche boundaries introduced within the WPP substreams by adopting, in starting entropy decoding one tranche of the WPP substream, the CABAC probabilities at the end of entropy decoding another tranche of the WPP substream; and decode the raw byte sequence payload to obtain the picture.

Another embodiment may have an encoder configured to forming, by encoding a picture, a raw byte sequence payload so as to describe the picture in WPP substreams with one WPP substream per LCU row of the picture with entropy encoding the raw byte sequence using CABAC, transmitting the raw byte sequence in tranches into which the WPP substreams are segmented, thereby having tranche boundaries introduced therein, and continuing CABAC probability adaptation in the entropy encoding across the tranche boundaries introduced within the WPP substreams.

Another embodiment may have a video bitstream including raw byte sequence payload describing a picture in WPP substreams with one WPP substream per LCU row of the picture and coded using CABAC, the video bitstream being decomposed into tranches of the WPP substreams into which the WPP substreams are segmented thereby having tranche boundaries introduced therein, with continuing CABAC probability adaptation across the tranche boundaries introduced within the WPP substreams, wherein each tranche includes an explicit indication of its rank among the tranches into which the WPP substream the respective tranche belongs to, is sequentially decomposed.

According to another embodiment, a method for decoding may have the steps of: receiving raw byte sequence payload describing a picture in WPP substreams with one WPP substream per LCU row of the picture and coded using CABAC from an encoder in tranches of the WPP substreams into which the WPP substreams are segmented thereby having tranche boundaries introduced therein; entropy decoding the tranches with continuing CABAC probability adaptation across the tranche boundaries introduced within the WPP substreams; and decoding the raw byte sequence payload to obtain the picture.

According to another embodiment, a method for transport demultiplexing may have the steps of: receiving a video bitstream including raw byte sequence payload describing a picture in WPP substreams with one WPP substream per LCU row of the picture and coded using CABAC, the video bitstream being decomposed into tranches of the WPP substreams into which the WPP substreams are segmented thereby having tranche boundaries introduced therein with continuing CABAC probability adaptation across the tranche boundaries introduced within the WPP substreams, wherein the each tranche includes information identifying, for each tranche, as to which WPP substream or tile, the respective tranche belongs to, and associating the tranches to the slices, WPP substreams or tiles using the information.

According to another embodiment, a method for encoding may have the steps of: forming, by encoding a picture, a raw byte sequence payload so as to describe the picture in WPP substreams with one WPP substream per LCU row of the picture with entropy encoding the raw byte sequence using CABAC, transmitting the raw byte sequence in tranches into which the WPP substreams are segmented thereby having tranche boundaries introduced therein, and continuing CABAC probability adaptation in the entropy encoding across the tranche boundaries introduced within the WPP substreams.

Another embodiment may have a computer program having a program code for performing, when running on a computer, an inventive method.

According to another embodiment, a transport demultiplexer may have: a multiplex buffer;

slice buffers for being pulled by a multi-threaded decoder allowing parallel decoding of a picture in WPP substreams or tiles; a transport buffer configured to collect data belonging to a TS packet of a predetermined elementary stream of a video bitstream, and forward the data to the multiplex buffer; wherein the transport demultiplexer is configured to evaluate NAL unit headers of NAL units of a NAL unit sequence packetized into the TS packets at an output of the multiplex buffer, drop substream markers inserted into the NAL unit sequence with storing the substream marker data carried within the substream makers and store data of slices of substreams or tiles within NAL units following substream markers a data field of which identifies an equal WPP substream or tile in one slice buffer, and data of slices of WPP substreams or tiles within NAL units following substream markers a data field of which identify different WPP substreams or tiles in different slice buffers.

Another embodiment may have a transport demultiplexer configured to receive a video bitstream including raw byte sequence payload describing a picture in slices, WPP substreams or tiles and coded using CABAC, the video bitstream being decomposed into tranches of the slices, WPP substreams or tiles with continuing CABAC probability adaptation across tranche boundaries, wherein the each tranche includes information identifying, for each tranche, as to which WPP substream or tile, the respective tranche belongs to, and to associate the tranches to the slices, WPP substreams or tiles using the information.

Another embodiment may have a system including an inventive transport demultiplexer, and the multi-threaded decoder, wherein the multi-threaded decoder is inventively embodied.

Another embodiment may have a video bitstream transmitting a sequence of NAL units including NAL unit headers, the sequence of NAL units having inserted thereinto substream markers, wherein NAL units carrying data of slices of an equal one of substreams or tiles, follow substream markers a data field of which identifies the equal substream or tile, and data of slices of different substreams or tiles follow different substream markers a data field of which identify the different substreams or tiles.

According to another embodiment, a method for transport demultiplexing using a multiplex buffer, slice buffers for being pulled by a multi-threaded decoder allowing parallel decoding of a picture in WPP substreams or tiles, and a transport buffer configured to collect data belonging to a TS packet of a predetermined elementary stream of a video bitstream, and forward the data to the multiplex buffer, may have the steps of: evaluating NAL unit headers of NAL units of a NAL unit sequence packetized into the TS packets at an output of the multiplex buffer, dropping substream marker NAL units with storing the substream marker data carried within the substream maker NAL units and storing data of slices of substreams or tiles within NAL units following substream marker NAL units a data field of which identifies an equal WPP substream or tile in one slice buffer, and data of slices of WPP substreams or tiles within NAL units following substream marker NAL units a data field of which identify different WPP substreams or tiles in different slice buffers.

Another embodiment may have a computer program having a program code for performing, when running on a computer, an inventive method.

In accordance with a first aspect of the present application, a raw byte sequence payload describing a picture in slices, WPP substreams or tiles and coded using context-adaptive binary arithmetic coding is subdivided or chopped into tranches with continuing the context-adaptive binary arithmetic coding probability adaptation across tranche boundaries. By this measure, tranche boundaries additionally introduced within slices, WPP substreams or tiles do not lead to a reduction in the entropy coding efficiency of these elements. On the other hand, however, the tranches are smaller than the original slices, WPP substreams or tiles and accordingly they may be transmitted earlier, i.e. with lower delay, than the un-chopped original entities, i.e. slices, WPP substreams or tiles.

In accordance with another aspect, which is combinable with the first aspect, substream marker NAL units are used within a sequence of NAL units of a video bitstream in order to enable a transport demultiplexer to assign data of slices within NAL units to the corresponding substreams or tiles so as to be able to, in parallel, serve a multi-threaded decoder with the corresponding substreams or tiles.

BRIEF DESCRIPTION OF THE DRAWINGS

Embodiments of the present invention will be detailed subsequently referring to the appended drawings, in which:

FIG. 4 shows a schematic illustrating an encoding, segmentation, interleaving and decoding of entropy slice data;

FIG. 6, including FIGS. 6A and 6B, shows a table of pseudocode illustrating NAL unit syntax FIG. 7 shows a table of pseudocode illustrating a sequence parameter set syntax FIG. 8 shows a table of pseudocode illustrating a Low Delay Slice layer RBSP syntax;

FIG. 9 shows a table of pseudocode illustrating a slice header syntax

FIG. 10 shows a table of pseudocode illustrating a Substream marker syntax

FIG. 11 shows a schematic illustrating an example for a Simple encapsulation of entropy slice data. (AF is the MPEG-2 TS Adaption Field);

FIG. 12 shows a schematic illustrating another example for a Single ES encapsulation of entropy slice data;

DETAILED DESCRIPTION OF THE INVENTION

Figure 1:
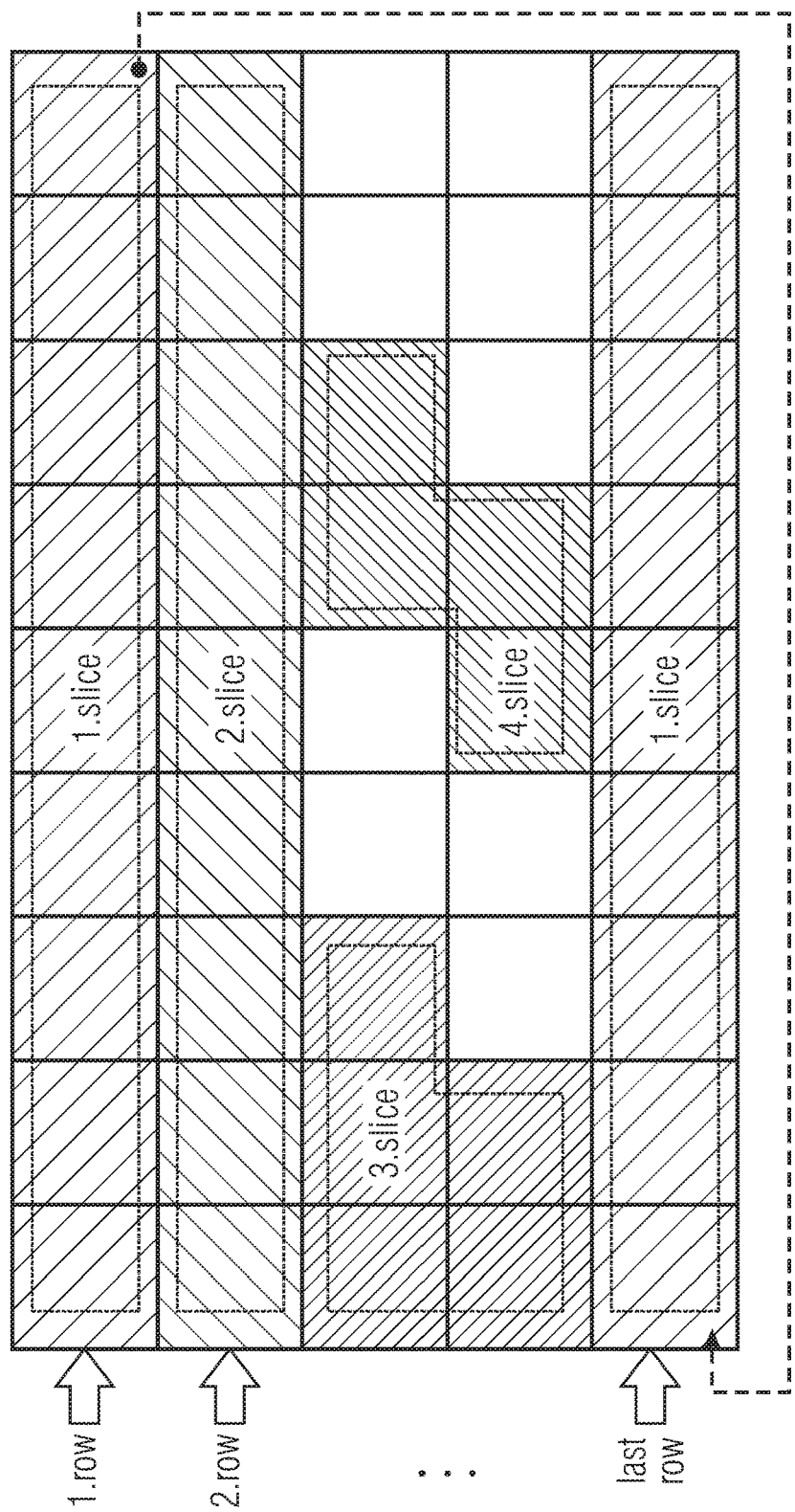
FIG. 1 shows a schematic illustrating the possible compounds of entropy slices.
Figure 2:
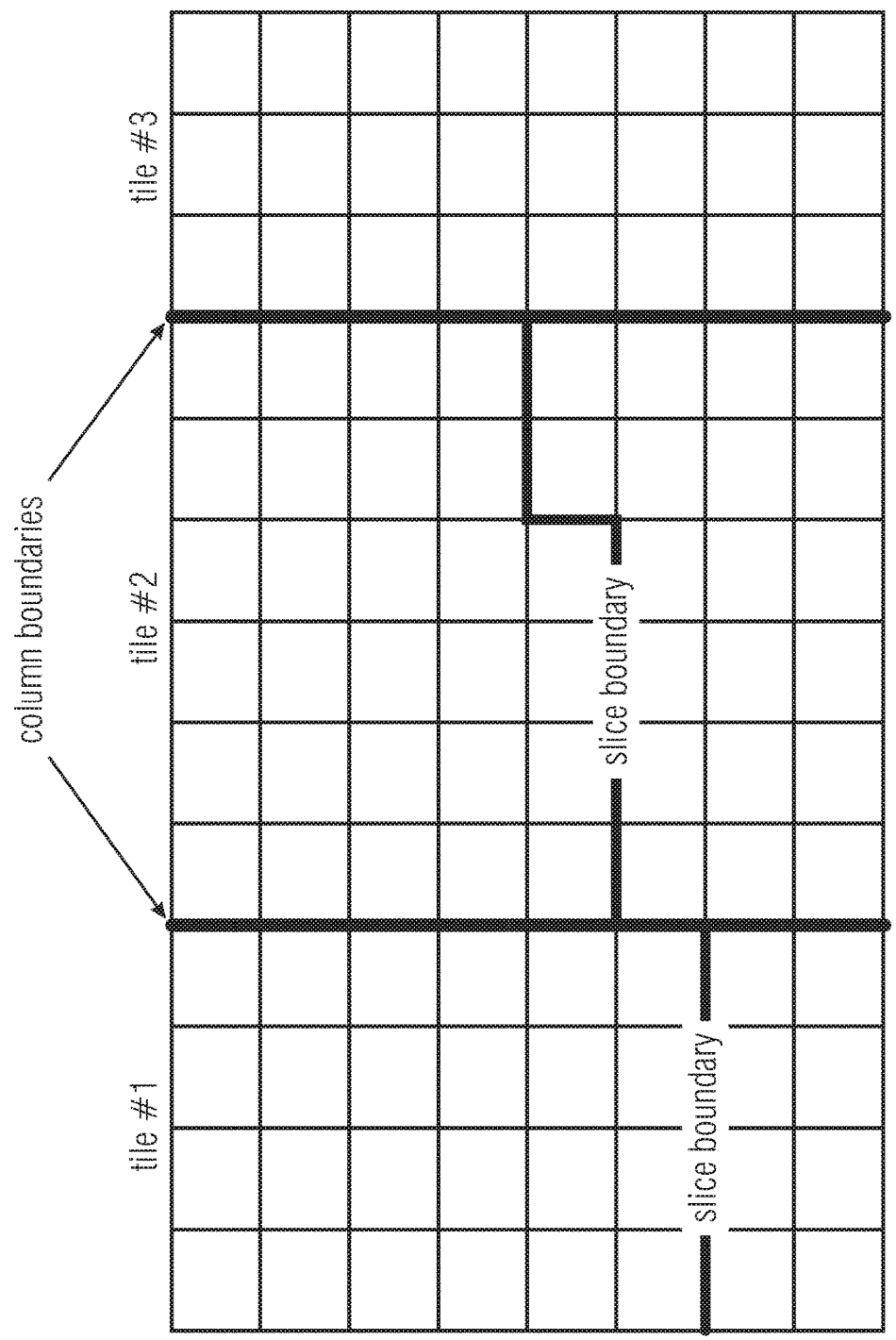
FIG. 2 shows a schematic illustrating three tiles spread over three slices.

In order to reduce the time, at which a parallel decoder thread can start and finish its data of a frame, the below embodiments use a segmentation of the data, structured for parallelization, such as data of one or more tiles or data of one or more WPP substreams into small tranches by a low delay interleaving approach.

Hence the encoder can deliver data, correspondent to a particular set of LCUs or at least byte aligned part of a substream or tile or parts thereof in form of a tranche to the decoder via the transmission path from encoder to decoder.

Since the tranches are smaller than the full WPP substream or tile, and/or may be adapted to the actual maximum transfer unit (MTU) of the transmission path, so that tranches of multiple WPP substreams or tiles can be arranged in a transfer unit between encoder and decoder, before finalization of the complete access unit, decoding at the decode side, can be started significantly earlier than if using a sequential transmission of the complete WPP substreams or tiles of an Access Unit.

This obviously results in faster transmission of the tranches and earlier start of a parallel decoding process at the decoder. The approach may be also applied over frame boundaries, in case, if the following frame's slice(s) or entropy slice(s) can be already decoded, e.g. in wavefront manner, based on the knowledge that the necessitated information for decoding an entropy slice of a following frame due to the availability of inter-frame references. Those already decodable data of a frame succeeding in decoding order may be derived from the maximum allowed/signaled motion vector length or additional information in the stream indicating the dependencies of data parts to the preceding frame(s)), or a fixed referencing scheme, indicating the position used signaled in a sequence-fixed position such as a parameter set.

A picture may be encoded with one entropy slice per largest coding unit (LCU)—row(s), or using WPP substream, or even a combination as one WPP substream per row which may be further contained in a separate Entropy Slice. Such data structures are necessitated for making use of the Wavefront processing technique at decoder side. Or Tiles may be used to allow parallel processing.

During the encoding process, bitstream of each slice, containing data of WPP streams or tiles, may be divided into tranches of variable size in order to match the maximum transfer unit size, between encoder and decoder. Then the resulted tranches are interleaved and can be passed to the transmission and put into packets of MTU size.

In order to allow a processing at the decoder side, before or after each tranche, a marker code may be inserted. An appropriate marker code for HEVC may be "0x00 00 02", which would even pass the start code emulation prevention. After reception of a packet including multiple tranches, the receiver or decoder can parse the actual contained bitstream during the start code emulation prevention process in order to not necessitate an additional parsing step. There may be, for example, two modes for tranche identification. There may be a cyclic arrangement of the tranches, starting from tranche with tranche_id (tranche identifier) equal to 1 to tranche with tranche_id equal to n. This may safe signaling data to the second general method. An alternative method may be a specific header following the marker, indicating the tranche_id, e.g. as an 8 bit value.

The de-interleaving of the interleaved tranche data may be applied based on the knowledge of number of tranches per packet, which may be a NAL unit packet. Therefore, there may be additionally a mapping of WPP substreams or tiles to tranches. This mapping may be implicitly derived from the number of tiles/number of WPP substreams, or may be signaled directly in the SPS. The mapping is important for the de-interleaving process, so that data of certain WPP substreams or tiles can be identified and served to the wavefront or parallel decoder thread in charge of decoding the WPP substream or tile in question.

In order to inform the decoder on using the interleaving scheme for low delay encapsulation, there may be a low_delay_flag in the NAL unit header.

Another mode may be a interleaving and de-interleaving on the transport layer, i.e. outside the decoding process maybe in the RTP [8] [9] [13] or MPEG-2 Transport Stream [7] layer:

Therefore, a header may be put in front of the packet, indicating the presence of a tranche by a flag including a size information in bytes per present tranche. Since the transport layer is decoupled from the decoding process, there may be no need for integrating a marker code, since additional information of the transport layer need to be removed anyway before passing those data to the decoder. The transport layer then also reorders the data for bitstream delivery to the decoder.

A variable length header, may be used on an extra multiplexing layer. This multiplexing layer may be also part of the codec and may be introduced before the actual Raw Byte Sequence Data (RBSP) access in the decoder. One header scheme can be found in FIG. 3. But there may be also a header directly in front of each tranche indicating the length as well as its indicator. Where there is still need of mapping the indicator to bitstream structures as already stated above.

The tranche size may be also of constant size, e.g. x bytes per tranche. This results in a simple multiplexing scheme, such as shown in FIG. 4.

The constant size of segments can bring a problem at the end of bitstream due to its variable length.

There are two general solutions possible. First one is a generation of cyclic x-byte segments (usually the bitstream representation of slice is byte-aligned) and controlling of consuming of bytes by each decoder-engine, i.e. the decoder finds out the completion of an entropy slice or including a marker code.

The second method is the signaling tranche lengths, if tranches are of variable length in a header as shown in the figure.

The size of segment and interleaving mode can be signaled either in one SEI-Message or in SPS.

The transmission scheme is shown in FIG. 4.

Figure 5:
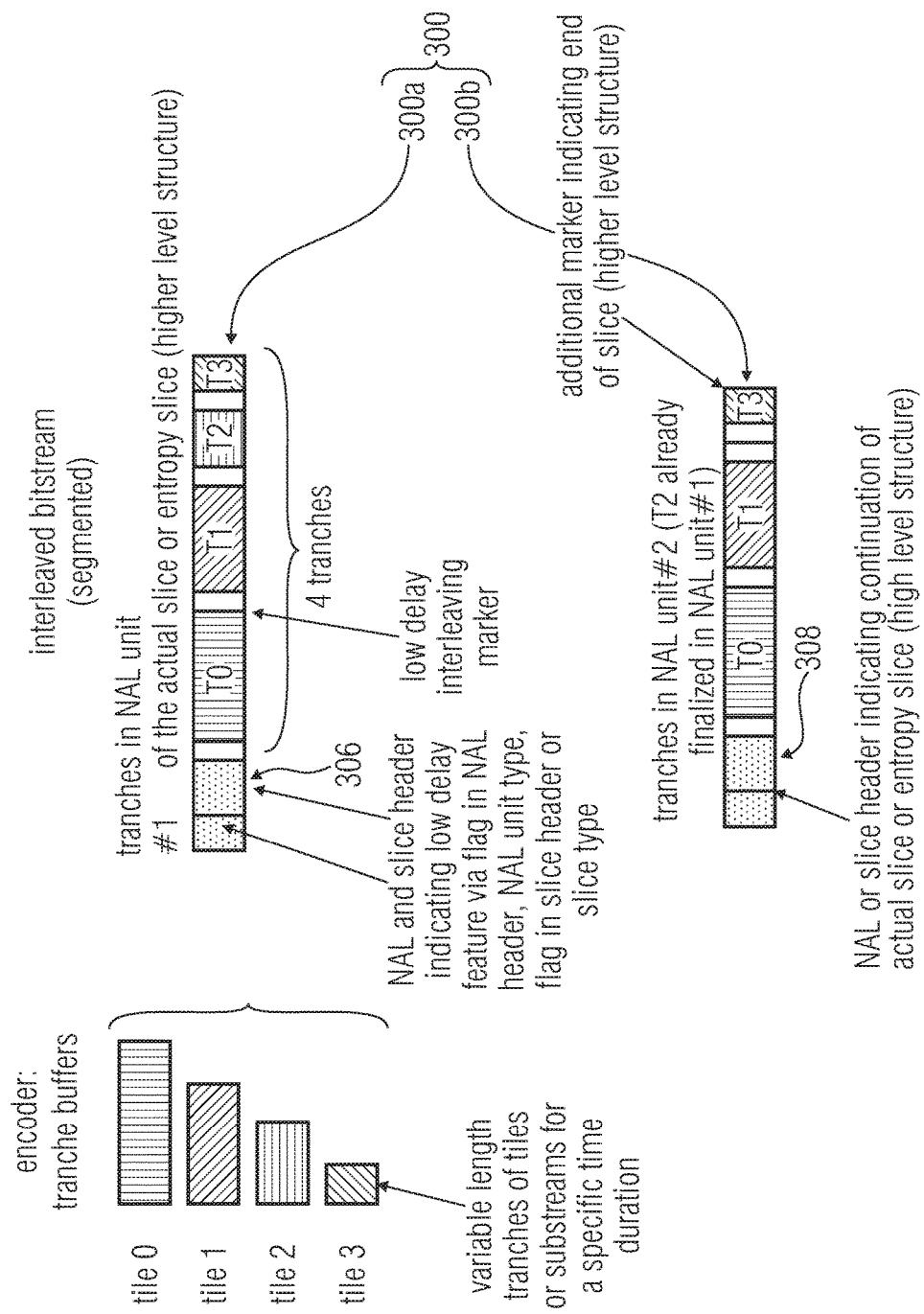
FIG. 5 shows a schematic illustrating an interleaving example of trances of four variable length tranche cyclic interleaving scheme using marker codes and spreading of actual slice data over multiple NAL units. The marker codes are used, even if the partition is not present. This can be further enhanced using a tranche identifier, following the maker, indicating the tranche number. This obsoletes the need of sending a marker, as necessitated for the cyclic mode.

Another interesting method is using of finalizing codes or marker codes at the end of the set of tranches in the packet, such as NAL or slice packet. In this case, variable length segments are possible, thus a full parsing of the bitstream is necessitated. In order to limit the memory access here, this additional parsing process for the multiplexing may be combined with the start code emulation prevention parsing, necessitated as first step before accessing the RBSP data contained in an NAL unit. Such a marker scheme is shown in FIG. 5.

The idea is here is to split in an interleaving manner, a higher level structure, such as an actual slice, entropy slice or similar, into its contained lower level data structure, such as WPP substreams or tiles, while interleaving the data into tranches. These tranches, each belonging to a lower level structure, e.g. a specific WPP substream or a tile, are interleaved in an low delay packet, which may be a specific NAL unit, a NAL unit with additional signaling by a low delay interleaving flag or even a slice or light weighted slice header indicating the low delay interleaving approach by a flag or the slice type, as shown for "NAL unit #1" in the figure, thus the decoder is informed to apply a reordering function for a "single" threaded decoder, that is using a sequential processing of the tranches in the original/de-interleaved order in the decoder. In order to split the data of an actual slice as interleaved tranches over multiple packets in order to gain the low delay feature, a transport layer may fragment the NAL unit containing the low delay interleaved data to networks packets of maximum MTU size. The fragmentation of the actual slice data into multiple NAL units may be also directly applied by the coding layer, thus there is a need to signal such type of NAL unit containing the continuation of a slice, as show in FIG. 5 for "NAL unit #2". In order to detect the finalization of interleaved data in multiple packets, such as NAL units. There may be the need of a specific finalization code as also shown for "NAL unit #2" in the figure or a flag which indicates the completion in the slice or NAL header.

In case of losing of the NAL packets, there is also a need of detecting losses. This may be applied by additional information in the header, e.g. the light-weighted slice header, such as the first MBs of the contained tranches, or only of a specific tranche #1. Having information such as the offsets for the WPP substreams or the actual size of the tranche, someone may also use these size values (offset values for a specific WPP substream or tile) in order to do a sanity check after receiving the NAL unit with the finalization code and the preceding NAL units.

That is, as described, the tranches may be packetized into packets 300 in manner so that each packet 300 comprises one tranche T# of each WPP substream or tile of the picture, or a subset of the WPP substreams or tiles of the picture (because, for example, a certain WPP substream or tile has already been completely conveyed by way of the preceding packets), arranged in an order # defined among the WPP substreams or tiles, each packet comprising a header 302 comprising information revealing the positions and/or lengths of the tranches T# packed into the respective packet 300, or markers 304 separating the tranches T# within the respective packet 300 from each other, wherein the decoder may be configured to, in receiving the raw byte sequence payload, use the information comprised by the headers 302 or the markers 304 so as to access the tranches within the packets. The packets 300a which comprise first—in accordance with the order defined among the WPP substreams or tiles—tranches of the WPP substreams or tiles of the picture, may comprise a low delay feature indicator 306, and packets 300b comprising second or subsequent—in accordance with the order defined among the WPP substreams or tiles—tranches T# of the WPP substreams or tiles of the picture, may comprise a continuation indicator 308. The packets 300 may be NAL units or slices In the following, an example for signaling syntax and semantics for the low delay interleaving into tranches is provided.

Nevertheless, the splitting of tranche data, such as data of a WPP substream or a tile, may be also applied on slice level or below, as stated above.

Now, an approach is shown, which can be combined with the parsing for start code emulation prevention in order to reduce additional processing steps. Therefore, an interleaving is applied at RBSP level of the HEVC codec.

A tranche may be seen as splitting RBSP data into sections to be interleaved in the NAL unit payload section for low delay data access. The finalization of a tranche may be indicated by the code 0x000002 and may be followed by an 8 bit tranche identifier tranche_id. The tranches may be interleaved in a cyclic manner, so that the tranche end code is not followed by the tranche_id, which is implicitly derived. Rbsp data in a single tranche correspond either to data of a tile, data of a substream, data of slice or data of an entropy slice.

In the NAL unit syntax, two modes may be allowed for the low delay interleaving as indicated by the "low delay encapsulation_flag", that is cyclic arrangement of the tranches as well as an indication of the tranche via an additional identifier "tranche_id" following the marker coder via a flag such as the "low delay cyclic_flag" in the NAL unit header. These two flags may be also present in the Sequence Parameter Sets, or even the APS. For the cyclic tranche arrangements, there may be still the need for knowing the number of tranches during the parsing, such as provided in the SPS as "num_low_delay_tranches".

In the NAL unit the interleaved "LD_rbsp_byte"s are read by the parser an reorder to the actual, sequential RBSP order in the last for-loop in the NAL syntax:
for (i=0, i++, i<num_low_delay_tranches){
  for (j=0, j++, j<NumBytesInRBSP[i]){
    rbsp_byte[NumBytesInRBSP++]=LD_rbsp_byte[j][i]
  }
}

There may be also an explicit signaling in the SPS or the APS for a fixed size of cyclic arranged tranches as indicated in the "low_delay_tranche_lenght_minusl". The latter has not been used in the NAL unit syntax example, but is straight forward if having a packetization as shown in FIG. 4 in mind. In the NAL unit syntax of FIG. 6 a packetization as shown in FIG. 5 and discussed above was the basic.

In order to allow this interleaving feature of tranches over multiple packets, such as slices and/or NAL units, there may be a requirement for a global buffer, such as the array of LD_rbsp_byte for the tranches, in order to have repeated access to RBSP data of already received NAL units.

In order to allow error resilience, after receiving a finalization code, or if the sum of the number of received bytes for a tranche is equal to the tranche size, which may be derived from the offset values as provided for the contained tranche data, e.g. from data concerning the respective WPP substream or tile which the tranche in question is part of.

An important requirement for WPP substreams arranged in interleaved low delay tranches is that by a tranche n+1 only data from tranche n is accessed, which is already provided in tranche n and already stored or available at the decoder.

Low Delay Slice layer RBSP syntax for re-ordering/de-interleaving on slice level could be designed as follows. In particular, the syntax should in that case have almost the same behavior as on the NAL unit layer, but the re-ordering has to be defined on the slice level. FIG. 8 shows the Low Delay Slice layer RBSP syntax.

In case of using the slice header for packetizing the interleaved tranches, there may be the requirement to indicate at codec level, if receiving a new slice, not to reset the CABAC state, since the entropy coding of tranches of, e.g. an WPP substream, should not be interrupted. Not to reset the CABAC in a slice is indicated as "no_cabac_reset_flag" in the slice header. The slice header shown is suitable for low delay slices, thus also the entropy_slice features should be present. A corresponding slice header syntax is shown in FIG. 9.

The transport layer enables optimization of the scheduling of data forwarded to the decoder unit(s) based on the fact if a number of substreams/tiles/tranches (on transport layer, we assume an abstract entity that can be represented by a substream, a tile, part of a substream or tile, or a part of the bitstream which has a similar function, i.e. it allows parallel decoding or gradual decoder refresh) in the coding layer can be processed independently of each other. One possibility is to start sending tranches in parallel to several decoding units with minimum delay. The bitstream consists of a sequence of NAL units which are the smallest items that can be handled individually on the transport layer. Consequently, the following methods of handling on the transport layer are based on substreams/tiles/tranches which are contained in separate slice or entropy slice NAL units.

The transport layer should also optimize decoder performance and error resilience based on the fact if the coding layer uses gradual decoder refresh. One option is to drop irrelevant parts of the bitstream if previous parts of the bitstream have not been received correctly, e.g. due to transmission errors, or have not been received at all, e.g. due to a switch between transport channels.

In order to allow for such exploitation/optimization, different information is signaled on the transport layer.

General side information is signaled using descriptors:

The number of substreams/tiles, where "1" means that there is only one stream/tile which contains the whole video frame Information common to all substreams/tiles, e.g. if all substreams/tiles are of the same size or the buffer requirements are the same Individual information about each substream/tile, e.g. if the substreams/tiles are of different size or their buffer requirements differ The number of gradual decoder refresh steps, where "1" means that gradual decoder refresh is not used A flag indicating whether these substreams/tiles allow for low delay parallel processing If the number of substreams/tiles >1, syntax elements are inserted in the stream before each data block that contains a certain substream/tile. These syntax elements follow the NAL unit syntax, but use a unique NAL unit type which is not used by the coding layer (e.g. nal_unit_type=0x19 or nal_unit_type=0x1F), in the following referred to as substream markers.

These syntax elements are used as markers and carry information about the data block that follows, at least a data field which identifies the substream/tile.

If the number of gradual decoder refresh steps >1, these syntax elements also carry a flag which indicates whether the substream/tile is intra coded (allows gradual decoder refresh).

A corresponding syntax is shown in FIG. 10. The following constraints could apply:

forbidden_zero_bit shall be equal to 0.
nal_ref_flag shall be equal to 0.
nal_unit_type shall be equal to 0x19.
substream_ID: counter value starting with 0 for the first slice that belongs to a picture, incremented by each further slice or entropy slice that belongs to the same picture.
is_intra: if '1', the following NAL unit contains an intra coded slice or intra coded entropy slice.

A method for the encapsulation of the video stream in a transport multiplex is shown in FIG. 11 where each slice or entropy slice is transported separately in an integer number of transport stream packets. If the size of the payload does not exactly match the available bytes in the fixed-sized TS packets, the last TS packet contains an adaptation field.

Figure 19:
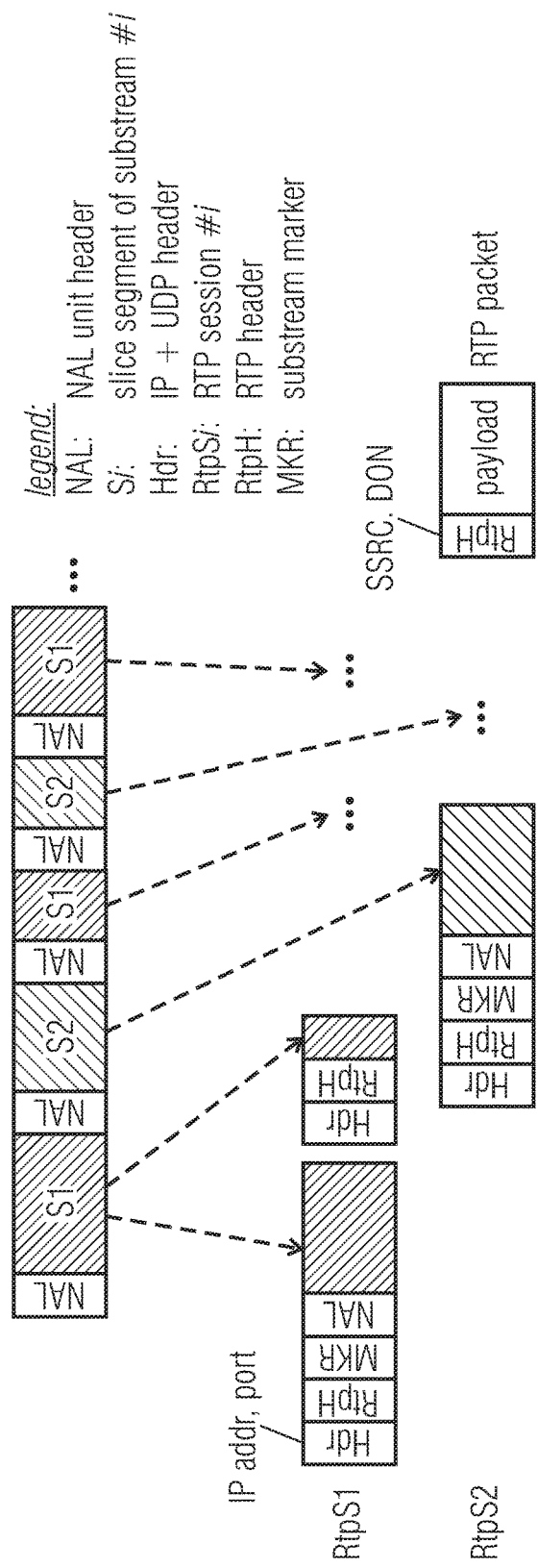
FIG. 19 shows a schematic illustrating an example for multi-ES using RTP.

It should be noted that a similar behavior of MPEG-2 Transport Stream's Elementary Stream can be also provided by an RTP Session or an RTP stream of the Real-time Transport Protocol as illustrated in FIG. 19. In RTP [8], an RTP Stream (identified by the media type and payload type as indicated in the SDP [12]) may be contained in its own RTP session, where an RTP Session is identified by the (IP) network address, the (UDP) port as well the source identifier (SSRC). A media session as indicated in the SDP may contain multiple RTP sessions, each containing a different media type. But it is also possible to transport the same media stream (e.g. video) in different RTP streams, where the RTP streams may be contained in the same RTP session (analogous to 1. below) or may be contained in their own RTP sessions (analogous to 2. below). FIG. 19 illustrates case 2.

RTP payload formats [9] [13] have a decoding order number (DON), which allows to recover the decoding order of NAL units at the receiver in case they are intentionally transmitted out of decoding order for error resilience purposes as described in [9] [13]. The additional markers MKR are, therefore, not necessitated. In case of transporting tranches of WPP substreams or Tiles in the order when they are becoming available from the encoding processes, the DON may be also used to recover the decoding order of tranches before providing them to a single decoder. But in this case, an additional delay would be introduced at the decoder due to the separate de-interleaving process before the decoding process. The system described in here can provide the encoded tranches directly to the decoding processes of the different WPP substreams or Tiles while the data is arriving at the receiver. The identification of the tranches associated with a WPP substream or Tile may be derived by the slice address in the slice segment header of the slice segment and the transmission order of the packets as indicated by the RTP sequence number in the RTP header. In this scenario, the DON is used only for backward compatibility, i.e. for decoders not providing the enhanced capability of decoding tranches of WPP substreams or Tiles sent out of decoding order when they arrive. The sending of tranche data out of decoding order is just applied with respect to WPP substream and Tiles level, i.e. in the transmitted data, the tranches of a single WPP substream or Tile are transmitted in decoding order, where the data of the different WPP substreams or Tiles is interleaved.

There are two possible options:
1. All slices and entropy slices are contained in the same elementary stream, i.e. the same PID is assigned to all TS packets of that video stream; in the following text this method is referred to single ES encapsulation.
2. Different PIDs are assigned to slices and entropy slices of the same video bitstream; in the following text this method is referred to multi-ES encapsulation.

FIG. 11 is valid for both options if the first option is regarded a special case of the more general structure by setting the same PID for all ES.

A more efficient way for the encapsulation in a single ES is shown in FIG. 12. Here, at most one adaptation field per picture is needed.

Figure 13:
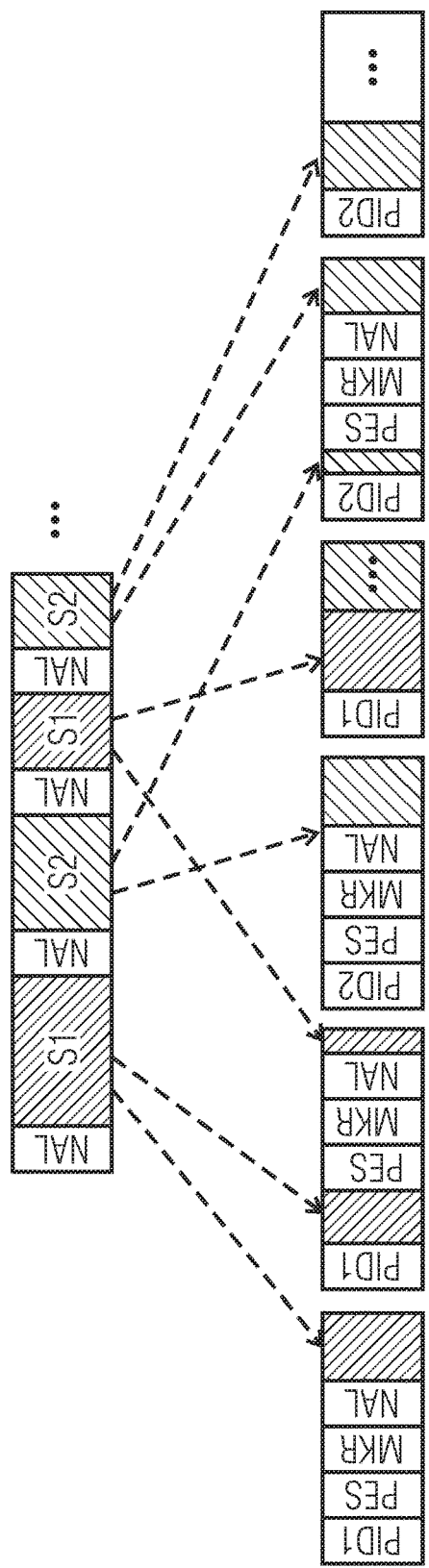
FIG. 13 shows a schematic illustrating another example for a Packed Multi-ES encapsulation of entropy slice data.

A more efficient way for the encapsulation in a multiple ES is shown in FIG. 13. Here, adaptation fields are avoided; instead, another slice, e.g. the collocated tile of the following picture, starts immediately in the same transport stream packet.

Figure 14:
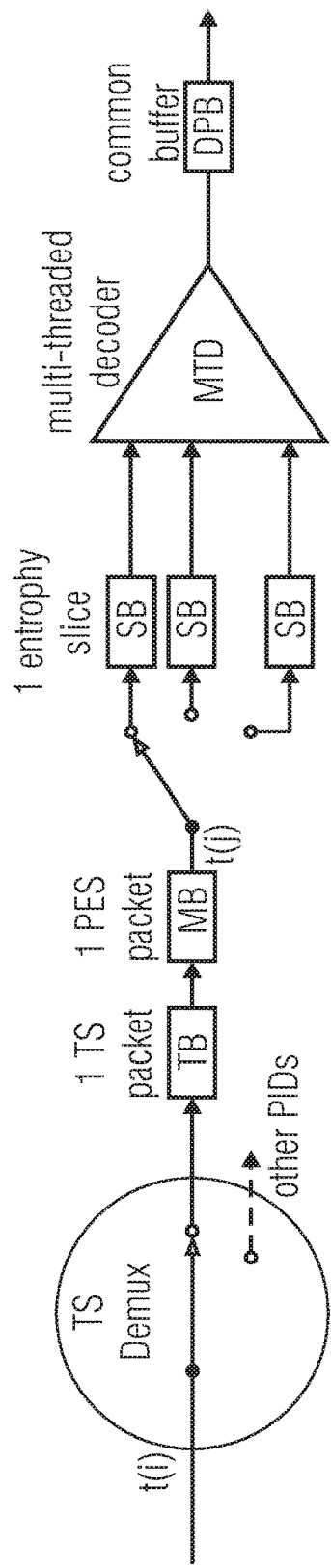
FIG. 14 shows a schematic block diagram showing a Transport demultiplexer for single ES.

A possible structure of the transport demultiplexer for the encapsulation with one single elementary stream (ES) targeting a multi-threaded decoder is shown in FIG. 14. Entropy Slice in the figure may contain data of a specific WPP substream or tile.

The Transport Buffer (TB) collects the data that belong to a transport packet and forwards that to the Multiplex Buffer (MB). At the output of MB, the NAL unit headers are evaluated and substream markers are dropped, while the data carried in the substream marker is stored. The data of each slice or entropy slice is stored in a separate Slice Buffer (SB) from where it is pulled by a multi-threaded decoder once a decoder thread is available.

Figure 15:
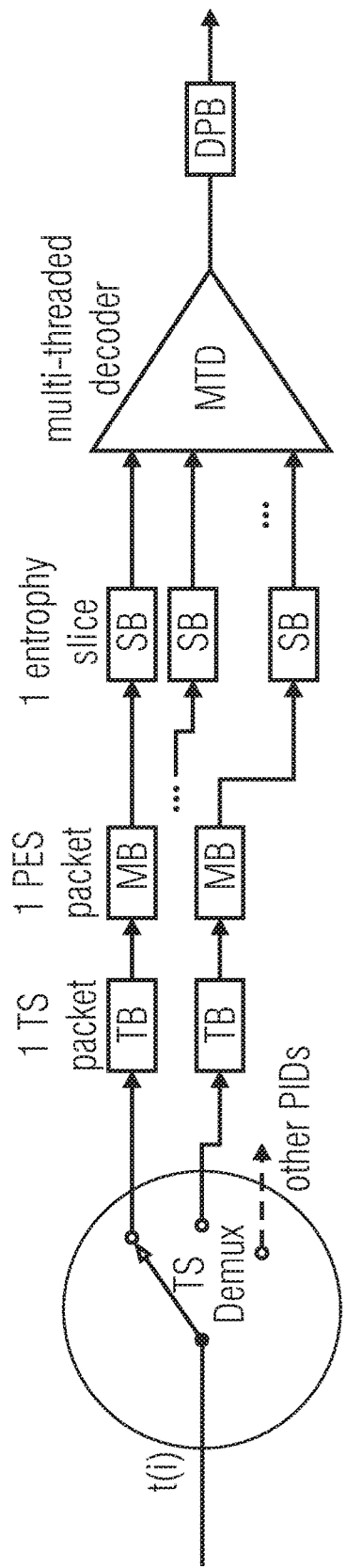
FIG. 15 shows a schematic block diagram showing a Transport demultiplexer for multi-ES.

A possible structure of the transport demultiplexer for the encapsulation with multiple elementary streams targeting a multi-threaded decoder is shown in FIG. 15.

The above outlined concepts are described again below in other words. The description below is, therefore, combinable with additional details of above description individually.

Figure 16:
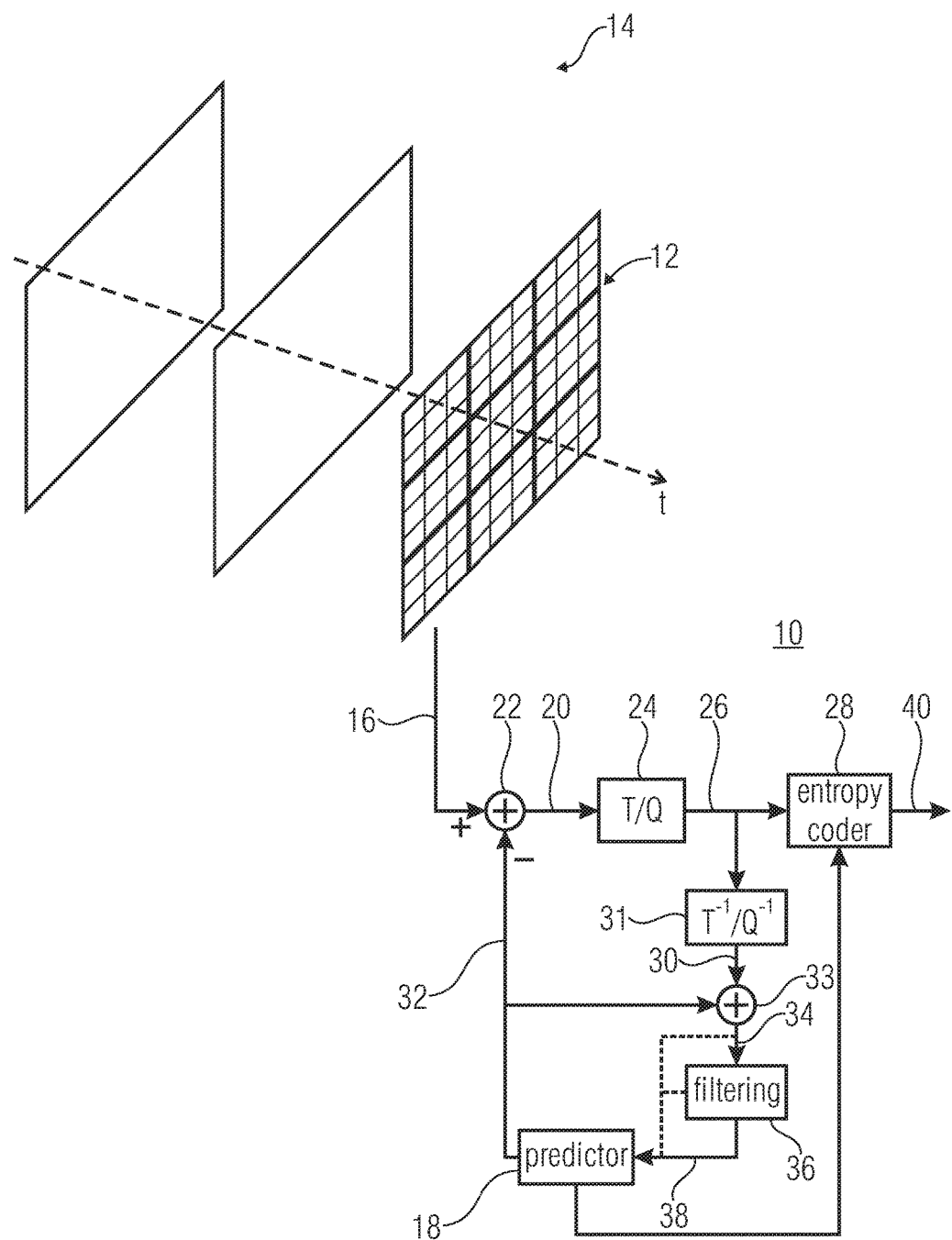
FIG. 16 shows a schematic block diagram showing an encoder.

FIG. 16 shows a general structure of an encoder in accordance with an embodiment of the present application.

The encoder 10 could be implemented to be able to operate in a multi-threaded way or not, i.e. merely single-threaded. That is, encoder 10 could, for example, be implemented using multiple CPU kernels. In other words, the encoder 10 could support parallel processing, but it does not have to. The coding concept of the present application enables parallel processing encoders to efficiently apply parallel processing without, however, compromising the compression efficiency. With regard to the parallel processing ability, similar statements are valid for the decoder, which is described later on with respect to FIG. 17.

The encoder 10 is a video encoder, but in general the encoder 10 may also be a picture encoder. A picture 12 of a video 14 is shown as entering encoder 10 at an input 16.

The encoder 10 is a hybrid encoder, i.e. picture 12 is predicted at a predictor 18 and the prediction residual 20 as obtained by a residual determiner 22, such as a subtractor, is subject to a transform, such as a spectral decomposition such as a DCT, and a quantization in a transform/quantization module 24. A quantized residual 26 thus obtained is subject to entropy coding in an entropy coder 28, namely context-adaptive binary arithmetic coding. The reconstructible version of the residual as available for the decoder, i.e. the dequantized and retransformed residual signal 30, is recovered by a retransform and requantization module 31, and combined with the prediction signal 32 of predictor 18 by combiner 33, thereby resulting in a reconstruction 34 of picture 12. However, encoder 10 operates on a block basis. Accordingly, reconstructed signal 34 suffers from discontinuities at block boundaries and accordingly, a filter 36 may be applied to the reconstructed signal 34 in order to yield a reference picture 38 on the basis of which predictor 18 predicts subsequently encoded pictures. As shown by dashed lines in FIG. 16, predictor 18 may, however, also exploit the reconstructed signal 34 directly without filter 36 or an intermediate version. In the case of picture coding, filter 36 may be left away.

The predictor 18 may choose among different prediction modes in order to predict certain blocks of picture 12. There may be a temporal prediction mode according to which a block is predicted on the basis of previously coded pictures, a spatial prediction mode according to which a block is predicted on the basis of previously coded blocks of the same picture, inter-layer prediction modes according to which a block of a picture showing the scene at a higher layer, such as at higher spatial resolution or from a further view point, is predicted on the basis of a corresponding picture showing this scene at a lower layer, such as at lower spatial resolution or from another view point.

A certain syntax is used in order to compile the quantized residual data 26, i.e. transform coefficient levels and other residual data, as well as the coding mode data including, for example, the prediction modes and prediction parameters for the individual blocks of the picture 12 as determined by the predictor 18 and these syntax elements are subject to entropy coding by entropy coder 28. The thus obtained data stream as output by entropy coder 28 is called a raw byte sequence payload 40.

The elements of the encoder 10 of FIG. 16 are interconnected as shown in FIG. 16.

Figure 17:
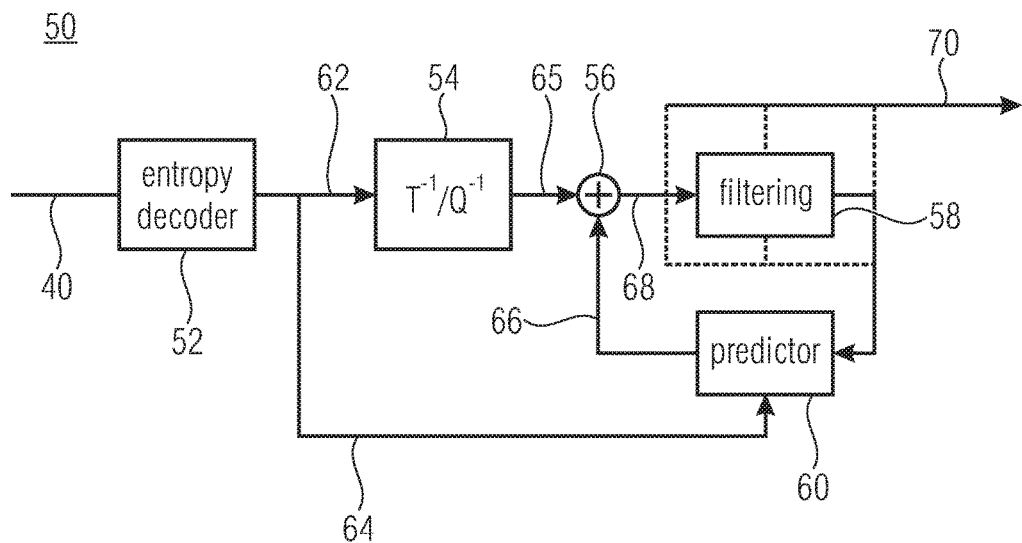
FIG. 17 shows a schematic block diagram showing a decoder.

FIG. 17 shows a decoder which fits to the encoder of FIG. 16, i.e. is able to decoder the raw byte sequence payload. The decoder of FIG. 17 is generally indicated by reference sign 50 and comprises an entropy decoder 52, a retransform/dequantizing module 54, a combiner 56, a filter 58 and a predictor 60. The entropy decoder 42 receives the raw byte sequence payload 40 and performs entropy decoding using context-adaptive binary arithmetic decoding in order to recover the residual signal 62 and the coding parameters 64. The retransform/dequantizing module 54 dequantizes and retransforms the residual data 62 and forwards the residual signal thus obtained to combiner 56. Combiner 56 also receives a prediction signal 66 from predictor 60 which, in turn, forms the prediction signal 66 using the coding parameters 64 on the basis of the reconstructed signal 68 determined by combiner 56 by combining the prediction signal 66 and the residual signal 65. As already explained above with respect to FIG. 16, the predictor 60 may use the filtered version of the reconstructed signal 68 or some intermediate version thereof, alternatively or additionally. The picture to be finally reproduced and output at output 70 of decoder 50 may likewise be determined on an unfiltered version of combination signal 68 or some filtered version thereof.

In accordance with the tile concept, picture 12 is subdivided into tiles and at least the predictions of blocks within these tiles are restricted to use, as a basis for spatial prediction, merely data relating to the same tile. By this measure, at least the prediction may be performed for each tile individually in parallel. For illustrative purposes only, FIG. 16 illustrates picture 12 as being subdivided into nine tiles. The subdivision of each tile into nine blocks as shown in FIG. 16 also merely serves as an example. Further, for the sake of completeness, it is noted that the way of coding the tiles separately may not be restricted to spatial prediction (intra prediction). Rather, any prediction of coding parameters of a respective tile across the tile's boundaries and any dependency of context selection in the entropy coding of a respective tile across the respective tile's boundaries may also be prohibited so as to be restricted to be dependent only on data of the same tile. Thus, the decoder is able to perform the just mentioned operations in parallel, namely in units of tiles.

In order to be transmitted via some transmission channel, the syntax elements have to be entropy coded slice-wise by entropy coder 28. To this end, entropy coder 28 scans the blocks of the tiles with traversing the blocks of a first tile first, then proceeding with the blocks of the next tile in tile order and so forth. A raster scan order may, for example, be used in order to scan the blocks within tiles and the tiles, respectively. Slices are then packed into NAL units which are the smallest units for transmission. Before entropy coding a slice, entropy coder 28 initializes its CABAC probabilities, i.e. the probabilities used to arithmetically code the syntax element of that slice. The entropy decoder 52 does the same, i.e. initializes its probabilities at slice beginnings. Each initialization, however, negatively affects the entropy coding efficiency since the probabilities are continuously adapted to the actual symbol probability statistics of the various contexts and accordingly resetting the CABAC probabilities represents a deviation from an adapted state. As known to a man skilled in the art, entropy coding leads to an optimal compression only if the probabilities fit the actual symbol probability statistics.

Figure 18:
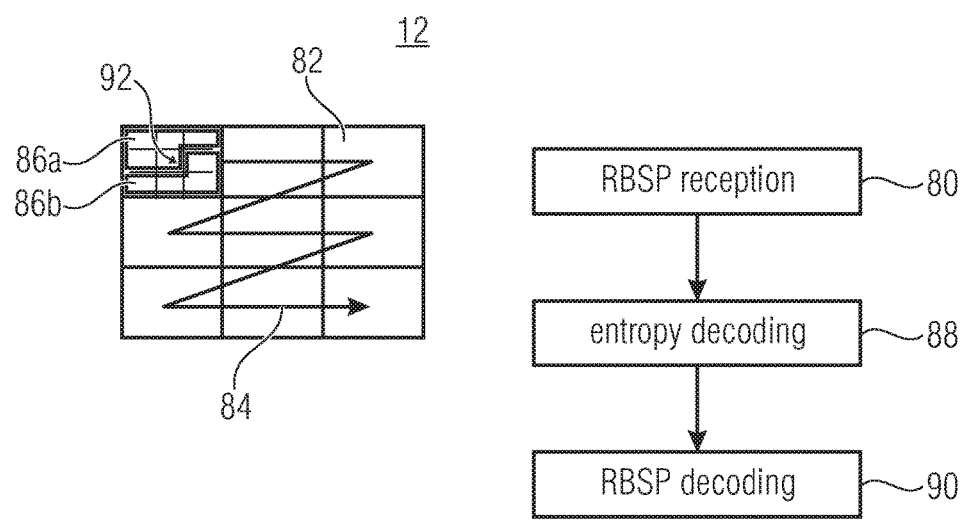
FIG. 18 shows a flow chart of steps performed by decoder.

Accordingly, a decoder, in accordance with an embodiment of the present application, operates as shown in FIG. 18. The decoder receives in step 80 the Raw Byte sequence payload describing a picture 12 in tiles 82, in tranches of tiles. In FIG. 18, the first tile 82 in tile order 84 is exemplarily shown to be chopped or split into two tranches 86a and 86b, each exemplarily covering a sub-sequence of the sequence of blocks within that tile. Then, in step 82, the tranches 86a and 86b are entropy decoded. However, in entropy decoding the tranches 86a and 86b, CABAC probability adaptation is continued across tranche boundaries. That is, during decoding tranche 86a, the CABAC probabilities are continuously adapted to the actual symbol statistics and the state at the end of entropy decoding tranche 86a is adapted in starting entropy decoding tranche 86b. In step 90, the Raw Byte sequence payload, thus entropy decoded, is decoded to obtain the picture 12.

Due to continuing CABAC probability adaptation across tranche boundaries 92 positioned in the inner of tiles 82, these tranche boundaries do not negatively affect the entropy coding efficiency beyond the sub-division of picture 12 into tiles 82. On the other hand, the tile parallel processing is still possible. Beyond that, it is possible to individually transmit the tranches and, as the tranches are smaller than complete tiles 82, it is possible to start in step 90 the decoding of each tile as soon as the first tranche of the respective tile has been received and entropy decoded.

The description of FIGS. 16 to 18 primarily concerned the usage of tiles. As described above, tiles result from a spatial partitioning of a picture. Similar to tiles, slices also spatially sub-divide a picture. Slices are, accordingly, also a means for enabling parallel encoding/decoding. Similar to tiles, prediction and so forth are prohibited so that slices are individually decodable. Accordingly, the description of FIGS. 16 to 18 is also valid for splitting-up slices into tranches.

The same applies when using WPP substreams. WPP substreams also represent a spatial partitioning of a picture 12, namely into WPP substreams. In contrast to tiles and slices, WPP substreams do not impose restrictions onto predictions and contact selections across WPP substreams. WPP substreams extend along block rows such as LCU rows, as shown in FIG. 4, and in order to enable parallel processing merely one compromise is made in relation to the CABAC entropy coding in order as defined among the WPP substreams (see FIG. 4) 92 and for each WPP substreams 92, except for the first WPP substream, the CABAC probabilities are not completely reset but adopted, or set to be equal to, the CABAC probabilities resulting after having entropy decoded the immediately preceding WPP substream up to the second LCU 94 thereof, with the LCU order starting, for each WPP substream, at the same side of the picture 12 such as the left-hand side as illustrated in FIG. 4. Accordingly, by obeying some coding delay between the sequence of WPP substream, these WPP substreams 92 are decodable in parallel so that the portions at which picture 12 is decoded in parallel, i.e., concurrently, forms a kind of wave front 96 which moves across the picture in a tilted manner from left to right.

That is, in transferring the description of FIGS. 16 to 18 to WPP substreams, any WPP substream 92 (FIG. 4) may also be sub-divided into tranches 98a and 98b without interrupting CABAC probability adaptation at the boundary 100 between these tranches 98a and 98b in the inner of the respective WPP substream 92, thereby avoiding penalties with respect to entropy coding efficiency due to the individual transmitability of both tranches 98a and 98b but maintaining the ability to use wave front parallel processing and enabling to start this wave front parallel processing earlier since the tranches are smaller than the complete WPP substreams 92.

Figure 3:
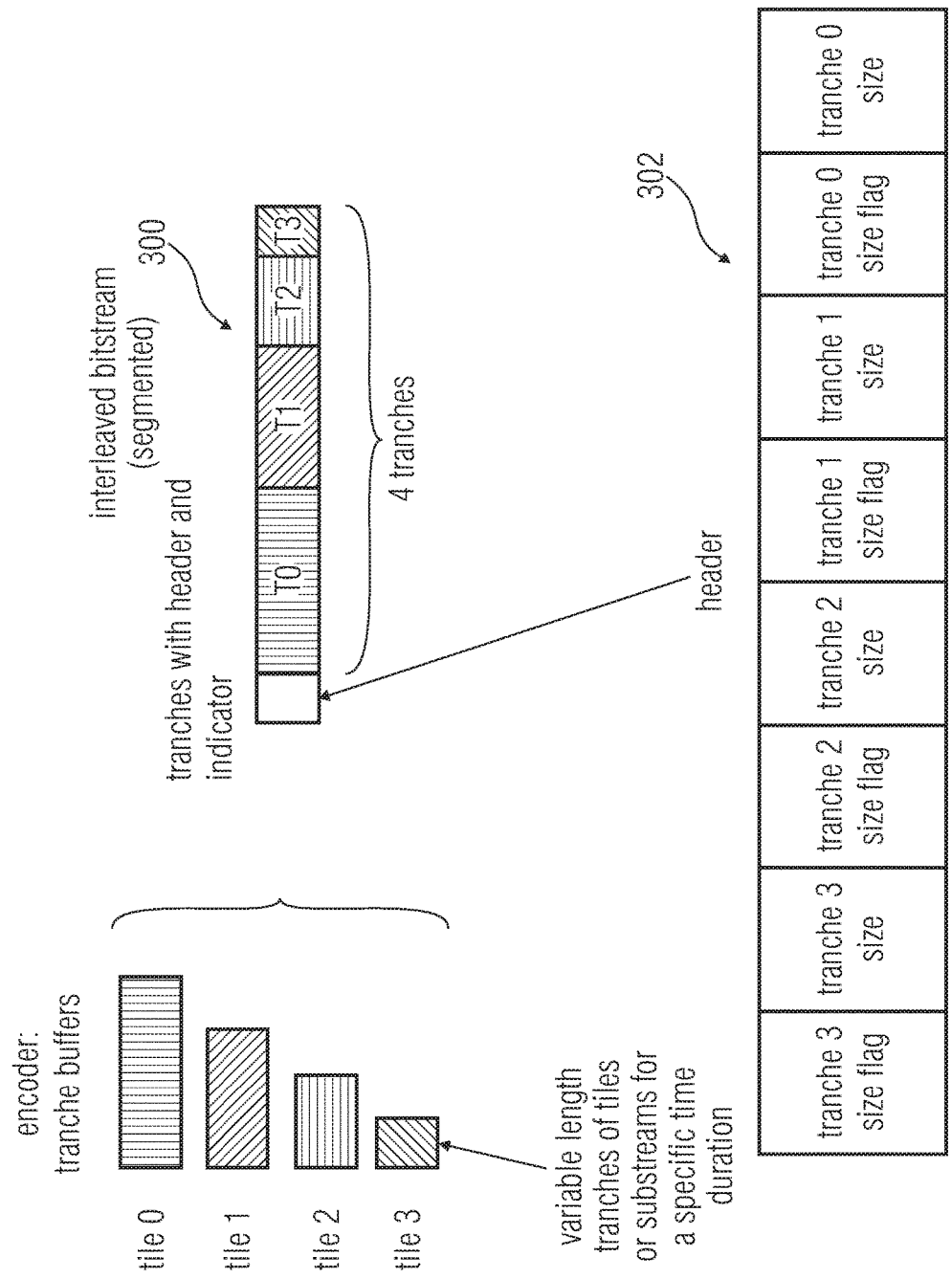
FIG. 3 shows a schematic illustrating an interleaving example of trances of a four variable length tranche cyclic interleaving scheme

As described above with respect to FIGS. 1 to 15, there are several possibilities to transmit tranches packetized into NAL units. Reference is made to FIG. 3 where tiles or substreams or slices of such tranches or substreams have been split-up into tranches in the arithmetically coded domain with a header preceding the nth tranche of each substream or tile and presenting information allowing localizing the tranche boundaries. Another embodiment was the one presented in FIG. 9. There, the sub-division of tiles or WPP substreams into tranches was done by slightly changing the slice structure: slices starting at a tile or WPP substream boundary, i.e., starting at the beginning of a tile or WPP substream, have the no_cabac_reset_flag set to zero, thereby causing the usual CABAC probability initialization/reset. Slices, however, carrying tranches which begin in the inner of a tile or WPP substream have the no_cabac_reset_flag set to one, thereby causing the afore-described continuation of the CABAC probability adaptation.

As far as the de-interleaving is concerned, which takes place in the reception step 80, for each tranche it is determined as to which WPP substream or tile the respective tranche belongs to. Different possibilities have been described above such as, for example, a round-robin cycling through the number of WPP substreams or tiles of a current picture. Alternatively, in case of using slice headers to transport the tranches, the slice headers may comprise an indication allowing localizing the beginning of the respective slice within the current picture 12.

In this regard, it is noted that the decomposition of the slices, WPP substreams or tiles into tranches is performed along a decoding order defined within each slice, WPP substream or tile: that is, within each slice, WPP substream or tile, the portion of the picture spatially covered by the respective slice, WPP substream or tile, is coded into, or decoded from, the respective slice, WPP substream or tile in that decoding order, and each tranche of a respective slice, WPP substream or tile covers a continuous portion of the respective slice, WPP substream or tile along that decoding order. By this manner, an order is defined among tranches belonging to the same slice, WPP substream or tile, namely the order of coding/decoding, and each tranche has a rank within that order. As the subdivision of the picture into WPP substreams or tiles is signaled to the decoder, the decoder knows about the subdivision. Accordingly, for associating each tranche with a respective WPP substream or tile, for example, it would suffice if each tranche has a starting address identifying a starting position from where on the respective tranche continuously covers the picture using the coding/decoding order of the tile/WPP substreams the respective tranche is part of. Even the order among the tranches which belong to a certain tile or WPP substream, for example, may be reconstructed at a transport demultiplexer or by the decoder using the starting positions. However, for resorting, the information of transport packet headers of lower OSI layers as described above with respect to RTP transmission, may be used, too, such as decoding order number, i.e. DON's. A transport demultiplexer of the just-mentioned type may be configured similarly to the above discussed transport demultiplexer so as to store data of tranches of equal WPP substream or tile in one slice buffer, and data of tranches of WPP substreams or tiles associated different WPP substreams or tiles in different slice buffers. As mentioned above, slice structure, i.e. slice headers, may be used to convey tranches.

Next, reference is made to the embodiments of FIGS. 11 to 15 in order to describe them again in other words. As described in these figures, slices Si are packetized into NAL units with each NAL unit 110 (see FIG. 11) comprising a NAL unit header 112. It should be noted that the slices Si may be normal slices or slices carrying tranches in accordance with FIG. 9. Accordingly, these slices solely carry data concerning one WPP substream or tile of a current picture, namely of the i-th WPP substream or tile, respectively. Via fragmentation, the NAL units 110 are transported via transport stream (TS) packets 114, namely the payload section 116 thereof. In doing so, each NAL unit 110 and the corresponding slice S, is preceded by a respective substream marker MKR indicating i, i.e., the WPP substream or tile the immediately following slice of the immediately following NAL unit 110 belongs to.

NAL units 110 carrying slices belonging to different WPP substreams or tiles may be distributed onto more than one elementary stream ES or onto the same elementary stream as explained in FIGS. 11 to 13. As mentioned above, "elementary stream" may also identify a separate RTP stream in its own RTP session.

As explained with respect to FIGS. 14 and 15, a transport demultiplexer may comprise a multiplex buffer MB, slice buffers SB and a transport buffer TB. The slice buffers SB are pulled by a multi-threaded decoder MTD which allows parallel decoding of a picture in WPP substreams or tiles. The transport buffer TB is configured to collect data belonging to a TS packet of a predetermined elementary stream of a video bit stream and forward the data to the multiplex buffer MB. The transport demultiplexer is then configured to evaluate NAL unit headers of NAL units of an NAL unit sequence packetized into the TS packets at an output of the multiplex buffer MB, drop substream marker NAL units MKR with storing the substream marker data carried within the substream marker NAL units and store data of slices of substreams or tiles within NAL units following substream marker NAL units, a data field of which identifies an equal WPP substream or tile in one, i.e., the same, slice buffer SB and data of slices of WPP substreams or tiles within NAL units following substream marker NAL units a data field of which identifies different WPP substreams or tiles in different slice buffers SB. As shown in FIG. 15, the transport demultiplexer may comprise a demultiplexer called TS demux in FIG. 15, and configured to receive the video bit stream and split TS packets of the video bit stream into different elementary streams, i.e., distribute the TS packet of the video bit stream to the different elementary streams. The demultiplexer performs this splitting or distribution according to PIDs contained within TS headers of the TS packet so that each elementary stream is composed of TS packets of a PAD different from PADs of TS packets of other elementary streams.

That is, if the slices correspond to the tranches in the sense of the embodiment of FIG. 9, the MTD, i.e., the multi-threaded decoder, is able to start processing more than one WPP substream or tile of a current picture as soon as the corresponding slice buffer SB of the respective WPP substream or tile has data contained therein, thereby reducing the delay.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The inventive encoded bitstream can be stored on a digital storage medium or can be transmitted on a transmission medium such as a wireless transmission medium or a wired transmission medium such as the Internet.

This above contributions, thus, inter alias, describe methods for low delay encapsulation and transmission of structured video data as provided by the new HEVC coding standard, such as structured in tiles, wavefront parallel processing (WPP) substreams, slices or entropy slices. Techniques have been, inter alias, presented which allow low delay transport in an parallelized encoder-transmitter-receiver-decoder environment through interleaved transport of entropy slices I slices I tiles I substreams. To solve the bottleneck problems outlined in the introductory portion of the specification and to minimize the delay of transmission and decoding time, i.e. the end-to-end delay, technique for an interleaved entropy slice scheme for parallel transmission and processing have been, inter alias, presented.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] Thomas Wiegand, Gary J. Sullivan, Gisle Bjontegaard, Ajay Luthra, "Overview of the H.264/AVC Video Coding Standard", IEEE Trans. Circuits Syst. Video Technol., vol. 13, N7, July 2003.
[2] JCTVC-E196, "Wavefront Parallel Processing", 5th JCT-VC Meeting, Geneva 2011.
[3] JCTVC-D070, "Lightweight slicing for entropy coding", 4th Meeting, Daegu, 2011.
[4] JCTVC-D073, "Periodic initialization for wavefront coding functionality", 4th Meeting, Daegu, 2011.
[5] HEVC WD5: Working Draft 5 of High-Efficiency Video Coding JTCVC-G1103, 5th JCT-VC Meeting, Geneva Meeting November 2011.
[6] JTCVC-D243, "Analysis of entropy slices approaches", 4th Meeting, Daegu, 2011.
[7] ISO/IEC 13818-1/2011, MPEG-2 Transport Stream including AMDs 1-6.
[8] IETF Real-time transport protocol, RTP RFC 3550.
[9] IETF RTP Payload Format, IETF RFC 6184.
[10] JCTVC-F275, Wavefront and Cabac Flush: Different Degrees of Parallelism Without Transcoding, Torino Meeting
[11] JCT-VC-F724, Wavefront Parallel Processing for HEVC Encoding and Decoding, Torino Meeting** at end of description
[12] IETF Session Description Protocol (SDP), RFC 4566
[13] IETF RTP Payload Format for High Efficiency Video Coding, draft-schierl-payload-h265

What is claimed:

1. A decoder configured to decode data representing an encoded picture of a video, the decoder comprising:
    an entropy decoder configured to decode data representing the encoded picture using context adaptive binary arithmetic coding (CABAC) entropy decoding to obtain a residual signal associated with the picture, wherein a row of the encoded picture is represented in a wavefront parallel processing (WPP) substream having at least two tranches, each of the at least two tranches having a header indicating a boundary of the respective tranche and including a flag that affects CABAC probability adaptation in CABAC entropy decoding of the respective tranche within the WPP substream,
    the entropy decoder being configured to entropy decode a current tranche of the at least two tranches using CABAC entropy decoding including (a) respective to the current tranche starting at a beginning of the WPP substream and the flag within the header of the current tranche having a first binary value, resetting the CABAC probability adaptation for the current tranche, and (b) responsive to the current tranche not starting at the beginning of the WPP substream and the flag within the header of the current tranche having a second binary value, using a CABAC probability of a previous tranche in the least two tranches, obtained during entropy decoding of the previous tranche across the boundary between the at least two tranches for entropy decoding of the current tranche; and
    a combiner to combine the residual signal and a prediction signal to reconstruct the picture.

2. The decoder according to claim 1, wherein the encoded picture includes a plurality of WPP substreams, each WPP substream representing one row of the encoded picture and including more than two tranches.

3. The decoder according to claim 2, wherein decoder is configured to deinterleave the tranches of the WPP substreams by identifying, for each tranche, a WPP substream to which the respective tranche belongs.

4. The decoder according to claim 2, wherein the tranches are packetized into packets in manner so that each packet comprises one tranche of each WPP substream of the picture, or a subset of the WPP substreams of the picture, arranged in an order defined among the WPP substreams, each packet comprising a header comprising information revealing positions and/or lengths of the tranches packed into the respective packet, or markers separating the tranches within the respective packet from each other, wherein the decoder is configured to use the information comprised by the headers or the markers so as to access the tranches within the packets.

5. The decoder according to claim 4, wherein packets comprising first, in accordance with the order defined among the WPP substreams, tranches of the WPP substreams of the picture, comprise a low delay feature indicator, and packets comprising second or subsequent, in accordance with the order defined among the WPP sub streams, tranches of the WPP substreams of the picture, comprise a continuation indicator.

6. The decoder according to claim 4, wherein the packets are NAL units.

7. The decoder according to claim 1, wherein the CABAC entropy decoding includes adopting the CABAC probability obtained at the end of the entropy decoding of the previous tranche across the boundary between the at least two tranches at the start of the entropy decoding of the current tranche.

8. An encoder configured to encode a picture of a video, the encoder comprising:
    a residual determiner configured to determine a residual signal associated with the picture based on a prediction signal; and
    an entropy encoder configured to encode the residual signal associated with the picture into a data stream using CABAC entropy encoding, wherein a row of the picture as encoded is represented in a wavefront parallel processing (WPP) substream having at least two tranches, each of the at least two tranches having a header indicating a boundary of the respective tranche and including a flag that affects CABAC probability adaptation in CABAC entropy encoding of the respective tranche within the WPP substream, the entropy encoder being configured to entropy encode a current tranche of the at least two using CABAC entropy encoding including (a) responsive to the current tranche starting at a beginning of the WPP substream and the flag within the header of the current tranche having a first binary value, resetting the CABAC probability adaptation for the current tranche, and (b) responsive to the current tranche not starting at the beginning of the WPP substream and the flag within the header of the current tranche having a second binary value, using a CABAC probability of a previous tranche in the at least two tranches, obtained during entropy encoding of the previous tranche across the boundary between the at least two tranches for entropy encoding of the current tranche.

9. The encoder according to claim 8, wherein the encoded picture includes a plurality of WPP substreams, each WPP substream representing one row of the picture and including more than two tranches.

10. The encoder according to claim 9, configured to interleave the tranches of the WPP substreams by providing identification information for each tranche indicating a WPP substream to which the respective tranche belongs.

11. The encoder according to claim 9, wherein the tranches are packetized into packets in manner so that each packet comprises one tranche of each WPP substream of the picture, or a subset of the WPP substreams of the picture, arranged in an order defined among the WPP substreams, each packet comprising a header comprising information revealing positions and/or lengths of the tranches packed into the respective packet, or markers separating the tranches within the respective packet from each other.

12. The encoder according to claim 11, wherein packets comprising first, in accordance with the order defined among the WPP substreams, tranches of the WPP substreams of the picture, comprise a low delay feature indicator, and packets comprising second or subsequent, in accordance with the order defined among the WPP sub streams, tranches of the WPP substreams of the picture, comprise a continuation indicator.

13. The encoder according to claim 11, wherein the packets are NAL units.

14. The encoder according to claim 8, wherein the CABAC entropy encoding includes adopting the CABAC probability obtained at the end of the entropy encoding of the previous tranche across the boundary between the at least two tranches at the start of the entropy decoding of the current tranche.

15. A non-transitory computer-readable medium for storing information related to an encoded picture of a video, comprising instructions, which when executed by a processor, causes generation of:

a data stream stored in the non-transitory computer-readable medium, the data stream comprising encoded information related to a residual signal associated with a picture of a video, wherein the residual signal is determined based on a prediction signal, and is entropy-decoded using context adaptive binary arithmetic coding (CABAC) entropy decoding, wherein a row of the encoded picture is represented in a wavefront parallel processing (WPP) substream having at least two tranches, each of the at least two tranches having a header indicating a boundary of the respective tranche and including a flag that affects CABAC probability adaptation in CABAC entropy decoding of the respective tranche within the WPP substream, wherein, a current tranche of the at least two tranches are entropy-decoded using the CABAC entropy decoding including (a) responsive to the current tranche starting at a beginning of the WPP substream and the flag within the header of the current tranche having a first binary value, resetting the CABAC probability adaptation for the current tranche, and (b) responsive to the current tranche not starting at the beginning of the WPP substream and the flag within the header of the current tranche having a second binary value, using a CABAC probability of a previous tranche in the at least two tranches, obtained during entropy decoding of the previous tranche across the boundary between the at least two tranches for entropy decoding of the current tranche.

16. The computer-readable medium according to claim 15, wherein the encoded picture includes a plurality of WPP substreams, each WPP substream representing one row of the encoded picture and including more than two tranches.

17. The computer-readable medium according to claim 16, wherein, as part of the CABAC entropy decoding, the tranches of the WPP substreams are deinterleaved by identifying, for each tranche, a WPP substream to which the respective tranche belongs.

18. The computer-readable medium according to claim 16, wherein the tranches are packetized into packets in the data stream in a manner so that each packet comprises one tranche of each WPP substream of the picture, or a subset of the WPP substreams of the picture, arranged in an order defined among the WPP substreams, each packet comprising a header comprising information revealing positions and/or lengths of the tranches packed into the respective packet, or markers separating the tranches within the respective packet from each other, wherein the information comprised by the headers or the markers is used to access the tranches within the packets.

19. The computer-readable medium according to claim 18, wherein packets comprising first, in accordance with the order defined among the WPP sub streams, tranches of the WPP substreams of the picture, comprise a low delay feature indicator, and packets comprising second or subsequent, in accordance with the order defined among the WPP sub streams, tranches of the WPP substreams of the picture, comprise a continuation indicator.

20. The computer-readable medium according to claim 18, wherein the packets are NAL units.

21. The computer-readable medium according to claim 15, wherein the CABAC entropy decoding includes adopting the CABAC probability obtained at the end of the entropy decoding of the previous tranche across the boundary between the at least two tranches at the start of the entropy decoding of the current tranche.

22. A method for decoding data representing an encoded picture of a video, the method comprising:

entropy decoding data representing the encoded picture using context adaptive binary arithmetic coding (CABAC) entropy decoding to obtain a residual signal associated with the picture, wherein a row of the encoded picture is represented in a wavefront parallel processing (WPP) substream having at least two tranches, each of the at least two tranches having a header indicating a boundary of the respective tranche and second tranches and including a flag that affects CABAC probability adaptation in CABAC entropy decoding of the respective tranche within the WPP substream, wherein the entropy decoding the a current tranche of the at least two tranches using CABAC entropy decoding includes (a) responsive to the current tranche starting at a beginning of the WPP substream and the flag within the header of the current tranche having a first binary value, resetting the CABAC probability adaptation for the current tranche, and (b) responsive to the current tranche not starting at the beginning of the WPP substream and the flag within the header of the current tranche having a second binary value, using a CABAC probability of a previous tranche in the at least two tranches, obtained during entropy decoding of the previous tranche across the boundary between the at least two tranches for entropy decoding of the current tranche; and combining the residual signal and a prediction signal to reconstruct the picture.

23. The method according to claim 22, wherein the encoded picture includes a plurality of WPP substreams, each WPP substream representing one row of the encoded picture and including more than two tranches.

24. The method according to claim 23, further comprising deinterleaving the tranches of the WPP substreams by identifying, for each tranche, a WPP substream to which the respective tranche belongs.

25. The method according to claim 23, wherein the tranches are packetized into packets in manner so that each packet comprises one tranche of each WPP substream of the picture, or a subset of the WPP substreams of the picture, arranged in an order defined among the WPP substreams, each packet comprising a header comprising information revealing positions and/or lengths of the tranches packed into the respective packet, or markers separating the tranches within the respective packet from each other, wherein the decoder is configured to use the information comprised by the headers or the markers so as to access the tranches within the packets.

26. The method according to claim 25, wherein the CABAC entropy decoding includes adopting the CABAC probability obtained at the end of the entropy decoding of the previous tranche across the boundary between the at least two tranches at the start of the entropy decoding of the current tranche.

* * * * *